US012648298B2

(12) United States Patent　　　　　(10) Patent No.: US 12,648,298 B2
Kwon et al.　　　　　　　　　　　　　(45) Date of Patent: Jun. 2, 2026

(54) DISPLAY DEVICE AND METHOD FOR MANUFACTURING THE SAME

(71) Applicant: Samsung Display Co., Ltd., Yongin-si (KR)

(72) Inventors: Seungwook Kwon, Hwaseong-si (KR); Woo Yong Sung, Seoul (KR); Seunggun Chae, Hwaseong-si (KR); Seung-Yeon Chae, Hwaseong-si (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 679 days.

(21) Appl. No.: 17/964,397

(22) Filed: Oct. 12, 2022

(65) Prior Publication Data

US 2023/0232659 A1　　Jul. 20, 2023

(30) Foreign Application Priority Data

Jan. 17, 2022　(KR) ........................ 10-2022-0006864

(51) Int. Cl.
H10K 50/87　　　(2023.01)
H10K 59/80　　　(2023.01)
(Continued)

(52) U.S. Cl.
CPC ......... H10K 50/87 (2023.02); H10K 59/8794 (2023.02); H10K 71/00 (2023.02);
(Continued)

(58) Field of Classification Search
CPC ..... H10K 50/87; H10K 59/00; H10K 59/8794
See application file for complete search history.

(56) References Cited

U.S. PATENT DOCUMENTS 9,209,414 B2　12/2015 Lim et al.
10,243,174 B2　3/2019 Li et al.
(Continued)

FOREIGN PATENT DOCUMENTS

CN　　104037337 A　9/2014
CN　　106409875 A　2/2017
(Continued)

OTHER PUBLICATIONS

Machine translation of CN-110911582-A (Year: 2020).*
(Continued)

*Primary Examiner* — Erik Kielin
(74) *Attorney, Agent, or Firm* — CANTOR COLBURN LLP

(57) ABSTRACT

A display device includes a display panel including a base layer, a first heat dissipation member disposed on a first surface of the base layer, and a second heat dissipation member disposed on a first surface of the first heat dissipation member. The first heat dissipation member includes a first polymer resin and first heat dissipation nano-particles dispersed in the first polymer resin, and the second heat dissipation member includes a second polymer resin and second heat dissipation nano-particles dispersed in the second polymer resin. The weight of the first heat dissipation nano-particles in the first heat dissipation member may be different from the weight of the second heat dissipation nano-particles in the second heat dissipation member.

19 Claims, 25 Drawing Sheets

(51) Int. Cl.

| | |
|---|---|
| *H10K 71/00* | (2023.01) |
| *H10K 71/80* | (2023.01) |
| *H10K 77/10* | (2023.01) |
| *H10K 102/00* | (2023.01) |

(52) U.S. Cl.
CPC ........... *H10K 71/80* (2023.02); *H10K 77/111* (2023.02); *H10K 2102/311* (2023.02); *H10K 2102/331* (2023.02)

(56) References Cited

U.S. PATENT DOCUMENTS

| | | | | |
|---|---|---|---|---|
| 11,087,110 | B2 | 8/2021 | Park et al. | |
| 11,406,044 | B2 | 8/2022 | Wu et al. | |
| 11,871,614 | B2 | 1/2024 | Jang et al. | |
| 2014/0319476 | A1* | 10/2014 | Lee | H10K 59/873 |
| | | | | 257/40 |
| 2016/0204366 | A1 | 7/2016 | Zhang et al. | |
| 2019/0075688 | A1 | 3/2019 | Chen et al. | |
| 2019/0097170 | A1* | 3/2019 | Bae | G09G 3/3291 |
| 2019/0393434 | A1 | 12/2019 | Liu et al. | |
| 2020/0411795 | A1* | 12/2020 | Kwon | H10K 50/844 |
| 2021/0202669 | A1* | 7/2021 | Paek | H10K 50/844 |
| 2021/0384457 | A1* | 12/2021 | Jang | H10K 59/8794 |
| 2022/0131107 | A1* | 4/2022 | Shin | H10K 59/874 |
| 2022/0166082 | A1 | 5/2022 | Wang et al. | |
| 2023/0112533 | A1* | 4/2023 | Wu | H10K 59/8794 |
| | | | | 257/712 |
| 2023/0189548 | A1* | 6/2023 | Park | H10K 59/87 |
| | | | | 257/40 |

FOREIGN PATENT DOCUMENTS

| | | | | |
|---|---|---|---|---|
| CN | 109285462 | A | 1/2019 | |
| CN | 110911582 | A * | 3/2020 | H10K 50/87 |
| CN | 111564677 | A | 8/2020 | |
| EP | 2902449 | A1 | 8/2015 | |
| EP | 3881756 | A1 | 9/2021 | |
| KR | 1020150059887 | A | 6/2015 | |
| KR | 101635835 | B1 | 7/2016 | |
| KR | 101976900 | B1 | 5/2019 | |
| KR | 1020190105682 | A | 9/2019 | |
| KR | 1020200070336 | A | 6/2020 | |
| KR | 1020210152068 | A | 12/2021 | |

OTHER PUBLICATIONS

Extended European Search Report for Application No. 23150238.6-1224 dated Oct. 2, 2023.

Partial European Search Report dated Jun. 2, 2023, issued in corresponding European Patent Application No. 23150238.6.

* cited by examiner

DISPLAY DEVICE AND METHOD FOR MANUFACTURING THE SAME

This application claims priority to Korean Patent Application No. 10-2022-0006864, filed on Jan. 17, 2022, and all the benefits accruing therefrom under 35 U.S.C. § 119, the content of which in its entirety is herein incorporated by reference.

BACKGROUND

1. Field

The disclosure herein relates to a display device a heat dissipation member and a method for manufacturing the display device including the heat dissipation member.

2. Description of the Related Art

In recent years, various display devices such as televisions (TVs), laptops, mobile phones, and the like are fast becoming high-performance and miniaturized, so that electronic components embedded in the display devices are becoming large-capacity and highly integrated. Accordingly, a large amount of heat is generated in electronic components of a display device. Heat generated in the display device may shorten the lifespan of a product or cause the failure or malfunction of the components. Methods for dissipating heat generated inside a display device to the outside are being studied.

SUMMARY

The disclosure provides a display device whose thickness is reduced and which has improved heat dissipation performance.

The disclosure also provides a method for manufacturing a display device, the method including forming a heat dissipation member and having improved manufacturing efficiency.

An embodiment of the invention provides a display device including a display panel including a base layer, a first heat dissipation member disposed on a first surface of the base layer, where the first heat dissipation member includes a first polymer resin and a first heat dissipation nano-particle dispersed in the first polymer resin, and a second heat dissipation member disposed on a first surface of the first heat dissipation member, where the second heat dissipation member includes a second polymer resin and a second heat dissipation nano-particle dispersed in the second polymer resin, where a weight of the first heat dissipation nano-particle in the first heat dissipation member is different from a weight of the second heat dissipation nano-particle in the second heat dissipation member.

In an embodiment, each of the first heat dissipation nano-particle and the second heat dissipation nano-particle may include at least one selected from reduced graphene oxide (RGO), carbon nanotube (CNT), copper, and aluminum.

In an embodiment, the first heat dissipation nano-particle included in the first heat dissipation member may be in an amount in a range of about 0.1 wt % to about 30 wt % based on a total weight of the first heat dissipation member, and the weight of the second heat dissipation nano-particle may be greater than the weight of the first heat dissipation nano-particle.

In an embodiment, each of the first polymer resin and the second polymer resin may include at least one selected from polyurethane resin and a polyethylene resin.

In an embodiment, the first heat dissipation member may include a heat dissipation plate and an impact absorption layer disposed on a first surface of the heat dissipation plate.

In an embodiment, the impact absorption layer may include at least one selected from silicone acrylate and epoxy acrylate.

In an embodiment, a thickness of the impact absorption layer may be greater than a thickness of the heat dissipation plate.

In an embodiment, the impact absorption layer may not include the first heat dissipation nano-particle.

In an embodiment, the impact absorption layer may have a storage modulus of about 100 MPa or less measured at about 25° C. by ASTM D 695 method.

In an embodiment, a sum of thicknesses of the first heat dissipation member and the second heat dissipation member may be in a range of about 10 μm to about 500 μm.

In an embodiment, a thickness of the first heat dissipation member may be greater than a thickness of the second heat dissipation member.

In an embodiment, the base layer may be a glass substrate, and the display panel may further include a buffer layer disposed on a second surface opposite to the first surface of the base layer, where the buffer layer may include at least one selected from aluminum, chrome, and titanium.

In an embodiment, the display panel may include a bending region, and a first non-bending region and a second non-bending region spaced apart from each other with the bending region interposed therebetween, where the first heat dissipation member may include a first heat dissipation plate and a second heat dissipation plate not overlapping the bending region, and respectively overlapping the first non-bending region and the second non-bending region, and the second heat dissipation member may include a third heat dissipation plate and a fourth heat dissipation plate not overlapping the bending region, and respectively overlapping the first non-bending region and the second non-bending region.

In an embodiment, the base layer may include a first glass substrate not overlapping the bending region and overlapping the first non-bending region, and a second glass substrate not overlapping the bending region and overlapping the second non-bending region.

In an embodiment, the base layer may include a polyimide substrate.

In an embodiment, the display panel may include a folding region and a first non-folding region and a second non-folding region spaced apart from each other with the folding region interposed therebetween, where in a state where the display panel is folded, at least a portion of the first non-folding region may overlap the second non-folding region, the first heat dissipation member may include a first heat dissipation plate and a second heat dissipation plate not overlapping the folding region, and spaced apart from each other with the folding region interposed therebetween, and the second heat dissipation member may include a third heat dissipation plate and a fourth heat dissipation plate not overlapping the folding region, and spaced apart from each other with the folding region interposed therebetween.

In an embodiment, the display panel may include a bending region, and a first non-bending region and a second non-bending region spaced apart from each other with the bending region interposed therebetween, where a first region of the first heat dissipation member overlapping the bending region may have a first thickness, and a second region of the first heat dissipation member overlapping the first non-bending region and the second non-bending region may have a second thickness, which is greater than the first thickness.

In an embodiment, a third region of the second heat dissipation member overlapping the bending region may have a third thickness, and a fourth region of the second heat dissipation member overlapping the first non-bending region and the second non-bending region may have a fourth thickness, which is greater than the third thickness.

In an embodiment, the display panel may be rollable around a rolling axis extending in a first direction, the first heat dissipation member may include a plurality of first heat dissipation sticks spaced apart from each other in a second direction which crosses the first direction and each extending in the first direction, and the second heat dissipation member may include a plurality of second heat dissipation sticks spaced apart from each other in the second direction and each extending in the first direction.

In an embodiment, the first heat dissipation member may have an adhesion force in a range of about 50 gf/inch to about 2000 gf/inch with respect to the base layer measured by ASTM D3330 method, and the second heat dissipation member may have an adhesion force in a range of about 50 gf/inch to about 2000 gf/inch with respect to the first heat dissipation member measured by ASTM D3330 method.

In an embodiment of the invention, a display device includes a display panel including a base layer, a circuit layer disposed on the base layer, and a display element layer disposed on the circuit layer, and a heat dissipation member disposed on a first surface of the base layer, where the heat dissipation member includes a polymer resin and a heat dissipation nano-particle dispersed in the polymer resin, where the display element layer includes a pixel definition layer, in which an opening is defined, and a light emitting element including a light emitting layer disposed in the opening, and the heat dissipation member includes a first portion having a first thickness and a second portion having a second thickness which is less than the first thickness, where the first portion overlaps the light emitting layer, and the second portion does not overlap the light emitting layer.

In an embodiment, the heat dissipation member may include a first heat dissipation member including a first polymer resin and a first heat dissipation nano-particle dispersed in the first polymer resin, and a second heat dissipation member including a second polymer resin and a second heat dissipation nano-particle dispersed in the second polymer resin.

In an embodiment of the invention, a method for manufacturing a display device includes preparing a display substrate including a plurality of preliminary display panels, forming a first heat dissipation member on a preliminary base layer included in the preliminary display panels by providing a first coating solution on a first surface of the preliminary base layer, forming a second heat dissipation member on the first heat dissipation member by providing a second coating solution on a first surface of the first heat dissipation member, and separating each of the preliminary display panels from the display substrate, where each of the first coating solution and the second coating solution includes a base resin and a heat dissipation nano-particle dispersed in the base resin, and is provided by an inkjet printing method or a dispensing method.

In an embodiment, the heat dissipation nano-particle may include at least one selected from reduced graphene oxide (RGO), carbon nanotube (CNT), copper, and aluminum.

In an embodiment, the forming the first heat dissipation member may include providing the first coating solution to form a heat dissipation plate, and providing a third coating solution including an acrylate resin on a first surface of the heat dissipation plate to form an impact absorption layer, where the base resin may include at least one of a polyurethane resin or a polyethylene resin.

In an embodiment, the acrylate resin may include at least one selected from silicone acrylate and epoxy acrylate.

In an embodiment, the base resin may not include the acrylate resin.

In an embodiment, the forming the first heat dissipation member may include photocuring the first coating solution, which is performed with the providing of a first coating solution in a same process.

In an embodiment, the first coating solution may include the heat dissipation nano-particle in a first weight, and the second coating solution may include the heat dissipation nano-particle in a second weight which is different from the first weight.

In an embodiment, the heat dissipation nano-particle included in the first coating solution may be in an amount in a range of about 0.1 wt % to about 30 wt % based on a total weight of the first coating solution, and the heat dissipation nano-particle included in the second coating solution may be in an amount of greater than about 50 wt % based on a total weight of the second coating solution.

In an embodiment, each of the preliminary display panels may include a deformation portion which is bendable or foldable, and a plurality of non-deformation portions spaced apart from each other with the deformation portion interposed therebetween, and each of the first coating solution and the second coating solution may be provided corresponding to the non-deformation portions.

In an embodiment, the preliminary base layer may include a glass substrate, and the preparing the display substrate may include forming a buffer layer on the preliminary base layer, forming a circuit layer on the buffer layer, forming a display element layer on the circuit layer, and removing one region of the preliminary base layer overlapping the deformation portion to form a base layer including a first glass substrate and a second glass substrate overlapping the non-deformation portions, where the first coating solution may be provided corresponding to a first surface of each of the first glass substrate and the second glass substrate.

In an embodiment, the buffer layer may include comprises at least one selected from aluminum, chrome, and titanium.

In an embodiment, the preliminary base layer may include a glass substrate, and the preparing the display substrate may include providing a polyimide substrate on the preliminary base layer, forming a circuit layer on the polyimide substrate, forming a display element layer on the circuit layer, and radiating a laser to the glass substrate and removing the glass substrate to form a base layer, where the first coating solution may be provided to a first surface of the base layer on which the polyimide substrate is provided.

BRIEF DESCRIPTION OF THE DRAWINGS

The accompanying drawings are included to provide a further understanding of embodiments of the invention, and are incorporated in and constitute a part of this specification. The drawings illustrate detailed embodiments of the invention and, together with the description, serve to explain principles of the invention. In the drawings.

DETAILED DESCRIPTION

Figure 1:
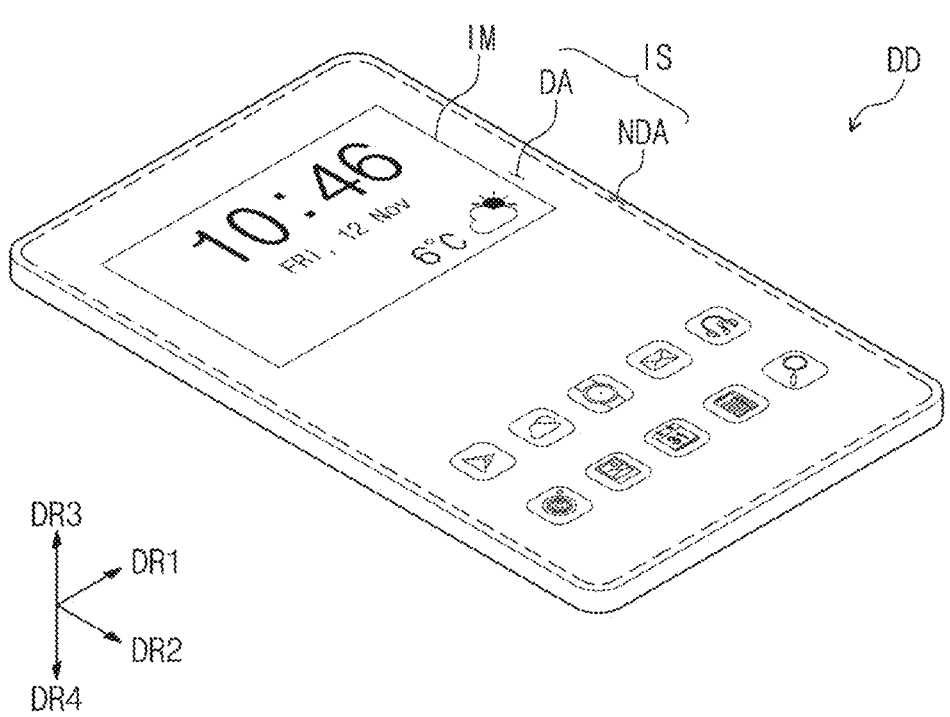
FIG. 1 is a perspective view showing a display device of an embodiment of the invention.

The invention now will be described more fully hereinafter with reference to the accompanying drawings, in which various embodiments are shown. This invention may, however, be embodied in many different forms, and should not be construed as limited to the embodiments set forth herein. Rather, these embodiments are provided so that this disclosure will be thorough and complete, and will fully convey the scope of the invention to those skilled in the art.

In the disclosure, when an element (or a region, a layer, a portion, etc.) is referred to as being "on," "connected to," or "coupled to" another element, it means that the element may be directly disposed on/connected to/coupled to the other element, or that a third element may be disposed therebetween.

Like reference numerals refer to like elements. Also, in the drawings, the thickness, the ratio, and the dimensions of elements are exaggerated for an effective description of technical contents.

It will be understood that, although the terms "first," "second," etc. may be used herein to describe various elements, these elements should not be limited by these terms. These terms are only used to distinguish one element from another. For example, a first element may be referred to as a second element, and a second element may also be referred to as a first element in a similar manner without departing the scope of rights of the invention. The terms of a singular form may include plural forms unless the context clearly indicates otherwise.

The terminology used herein is for the purpose of describing particular embodiments only and is not intended to be limiting. As used herein, "a", "an," "the," and "at least one" do not denote a limitation of quantity, and are intended to include both the singular and plural, unless the context clearly indicates otherwise. For example, "an element" has the same meaning as "at least one element," unless the context clearly indicates otherwise. "At least one" is not to be construed as limiting "a" or "an." "Or" means "and/or." As used herein, the term "and/or" includes any and all combinations of one or more of the associated listed items.

In addition, terms such as "below," "lower," "above," "upper," and the like are used to describe the relationship of the elements shown in the drawings. The terms are used as a relative concept and are described with reference to the direction indicated in the drawings.

It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" can mean within one or more standard deviations, or within +30%, 20%, 10% or 5% of the stated value.

Unless otherwise defined, all terms (including technical and scientific terms) used herein have the same meaning as commonly understood by one of ordinary skill in the art to which the invention pertains. It is also to be understood that terms such as terms defined in commonly used dictionaries should be interpreted as having meanings consistent with the meanings in the context of the related art, and should not be interpreted in too ideal a sense or an overly formal sense unless explicitly defined herein.

Embodiments are described herein with reference to cross section illustrations that are schematic illustrations of idealized embodiments. As such, variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the present claims.

Hereinafter, embodiments of the invention will be described in detail with reference to the accompanying drawings.

FIG. 1 is a perspective view showing a display device of an embodiment of the invention.

A display device DD of an embodiment may be a device activated based on an electrical signal. The display device DD may be a flexible device. In an embodiment, for example, the display device DD may be a portable electronic apparatus, a tablet computer, a car navigation system unit, a game console, a personal computer, a laptop computer, or a wearable device, but is not limited thereto. In FIG. 1, an embodiment where the display device DD is a portable electronic apparatus is illustrated.

The display device DD may display an image IM through a display surface IS. The display surface IS may include a display region DA and a non-display region NDA adjacent to the display region DA. The non-display region NDA may be a region in which an image is not displayed. However, the embodiment of the invention is not limited thereto, and alternatively, the non-display region NDA may be omitted. The display surface IS may include a plane defined by a first direction axis DR1 and a second direction axis DR2.

In the disclosure, the first direction axis DR1 and the second direction axis DR2 are perpendicular to each other, and a third direction axis DR3 and a fourth direction axis DR4 may be a normal direction with respect to the plane defined by the first direction axis DR1 and the second direction axis DR2. The fourth direction axis DR4 may be parallel to the normal direction with respect to the plane defined by the first direction axis DR1 and the second direction axis DR2, and the fourth direction axis DR4 may be a direction opposite to the third direction axis DR3. The thickness direction of the display device DD may be a direction parallel to the third direction axis DR3. On the basis of the third direction axis DR3, a first surface and a second surface may be defined. In the disclosure, the first surface may be referred to as a lower surface, a lower portion surface, one surface, and the like, and the second surface may be referred to as an upper surface, an upper portion surface, the other surface, and the like.

Directions indicated by the first to fourth direction axes DR1, DR1, DR2, DR3, and DR4 described in the disclosure are relative concepts, and may be converted into different directions. In addition, the directions indicated by the first to fourth direction axes DR1, DR2, DR3, and DR4 may be referred to as first to fourth directions, respectively, and may be denoted by the same reference numerals. In the disclosure, an upper portion may mean a direction in which the third direction axis DR3 is extended, and a lower portion may mean a direction in which the fourth direction axis DR4 is extended.

Figure 2A:
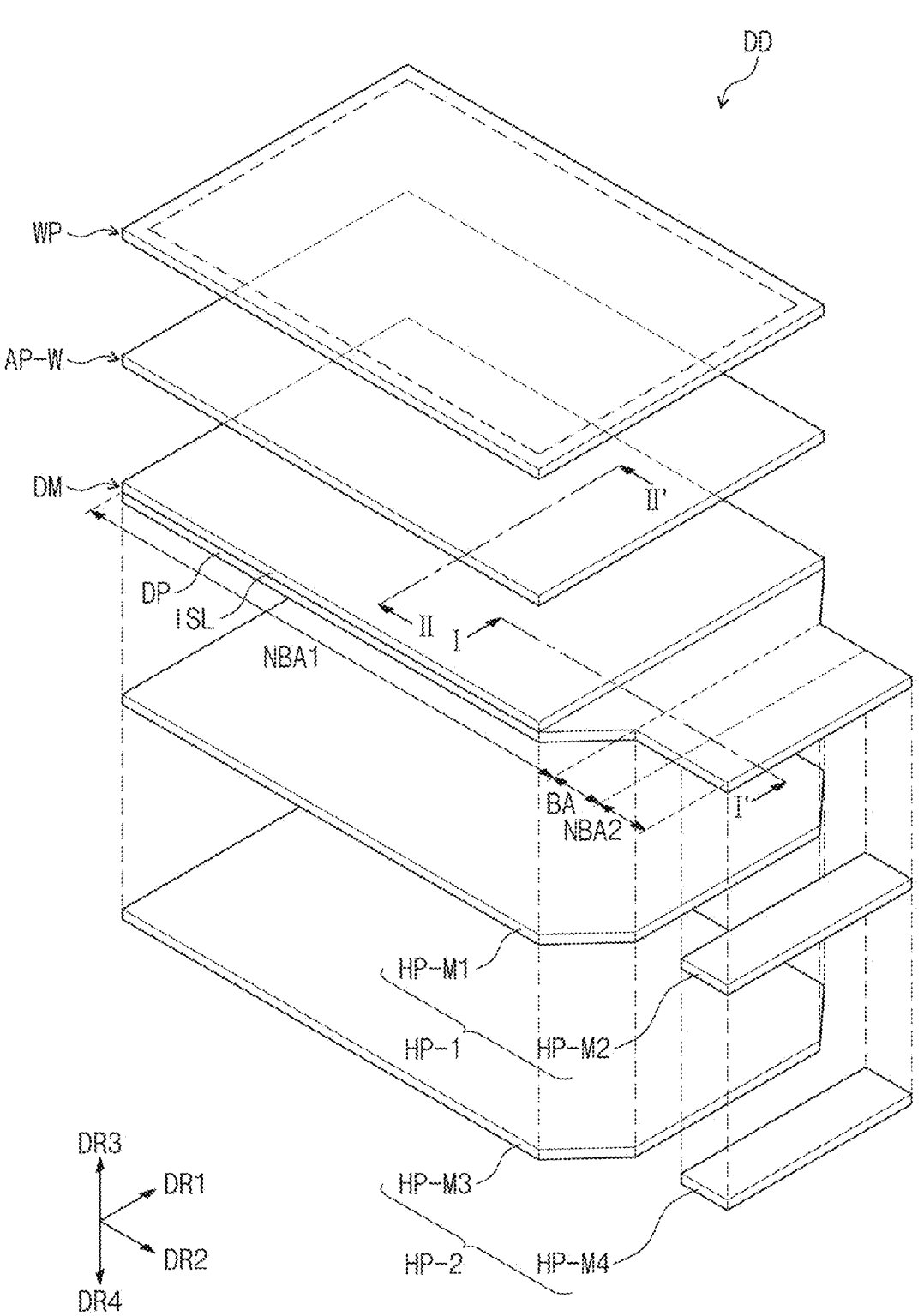
FIG. 2A is an exploded perspective view showing a display device of an embodiment of the invention.

FIG. 2A is an exploded perspective view of the display device DD according to an embodiment of the invention. The display device DD of an embodiment may include a display module DM, and heat dissipation members HP-1 and HP-2 disposed under the display module DM. The display module DM may include a display panel DP and an input sensing layer ISL disposed in an upper portion the display panel DP. The heat dissipation members HP-1 and HP-2 may include a first heat dissipation member HP-1 and a second heat dissipation member HP-2 disposed under the first heat dissipation member HP-1. The first heat dissipation member HP-1 may include a first polymer resin and first heat dissipation nano-particles dispersed in the first polymer resin, and the second heat dissipation member HP-2 may include a second polymer resin and second heat dissipation nano-particles dispersed in the second polymer resin. Herein, a heat dissipation nano-particle means an electrically conductive nano-particle. In an embodiment, the display device DD including the first heat dissipation member HP-1 and the second heat dissipation member HP-2 which are disposed in a lower portion of the display panel DP may exhibit high reliability.

Referring to FIG. 2A, an embodiment of the display device DD may include a protective member WP disposed on (e.g., above or on a second or upper surface of) the display module DM and an adhesive layer AP-W disposed between the protective member WP and the display module DM. The protective member WP may include a window. In addition, the protective member WP may include a functional layer such as an anti-fingerprint layer or a hard coating layer disposed on the window.

The protective member WP and the display module DM may be coupled to each other by the adhesive layer AP-W. The adhesive layer AP-W may include a typical adhesive such as a pressure sensitive adhesive (PSA), an optically clear adhesive (OCA), or an optically clear resin (OCR), but is not limited to any one embodiment.

The input sensing layer ISL may sense an external input, change the external input into a predetermined input signal, and provide the input signal to the display panel DP. In an embodiment of the display device DD, for example, the input sensing layer ISL may be a touch sensing unit configured to sense a touch. The input sensing layer ISL may recognize a direct touch of a user, an indirect touch of a user, a direct touch of an object, an indirect touch of an object, or the like.

In an embodiment, the input sensing layer ISL may sense at least one of the position of a touch and the intensity (pressure) of a touch, which is applied externally. The input sensing layer ISL may have various configurations, or may be composed of various materials, and is not limited to any one embodiment. The input sensing layer ISL may include a plurality of sensing electrodes (now shown) configured to sense an external input. The sensing electrodes (not shown) may sense the external input in an electrostatic capacitive manner. The display panel DP may receive an input signal from the input sensing layer ISL, and generate an image in response to the input signal.

The display panel DP may include a bending region BA and a first non-bending region NBA1 and a second non-bending region NBA2 spaced apart from each other with the bending region BA interposed therebetween. The first non-bending region NBA1, the bending region BA, and the second non-bending region NBA2 may be sequentially disposed in a direction in which the second direction axis DR2 is extended. On a plane defined by the first direction axis DR1 and the second direction axis DR2 or when viewed on a plan view in the third direction axis DR3, the area of the first non-bending region NBA1 may be greater than the area of the bending region BA and the area of the second non-bending region NBA2.

Each of the first dissipation member HP-1 and the second heat dissipation member HP-2 may not overlap the bending region BA. Herein, when two elements overlap each other, the two elements may overlap each other in the third direction axis DR3. The first heat dissipation member HP-1 may include a first heat dissipation plate HP-M1 overlapping the first non-bending region NBA1 and a second heat dissipation plate HP-M2 overlapping the second non-bending region NBA2. The second heat dissipation member HP-2 may include a third heat dissipation plate HP-M3 overlapping the first non-bending region NBA1 and a fourth heat dissipation plate HP-M4 overlapping the second non-bending region NBA2. The display device DD of an embodiment includes the first dissipation member HP-1 and the second heat dissipation member HP-2 not overlapping the bending region BA, and thus, may exhibit properties in which impact resistance and heat dissipation performance are improved, and the display panel DP are easily bent. The first dissipation member HP-1 and the second heat dissipation member HP-2 will be described in greater detail later.

Figure 2B:
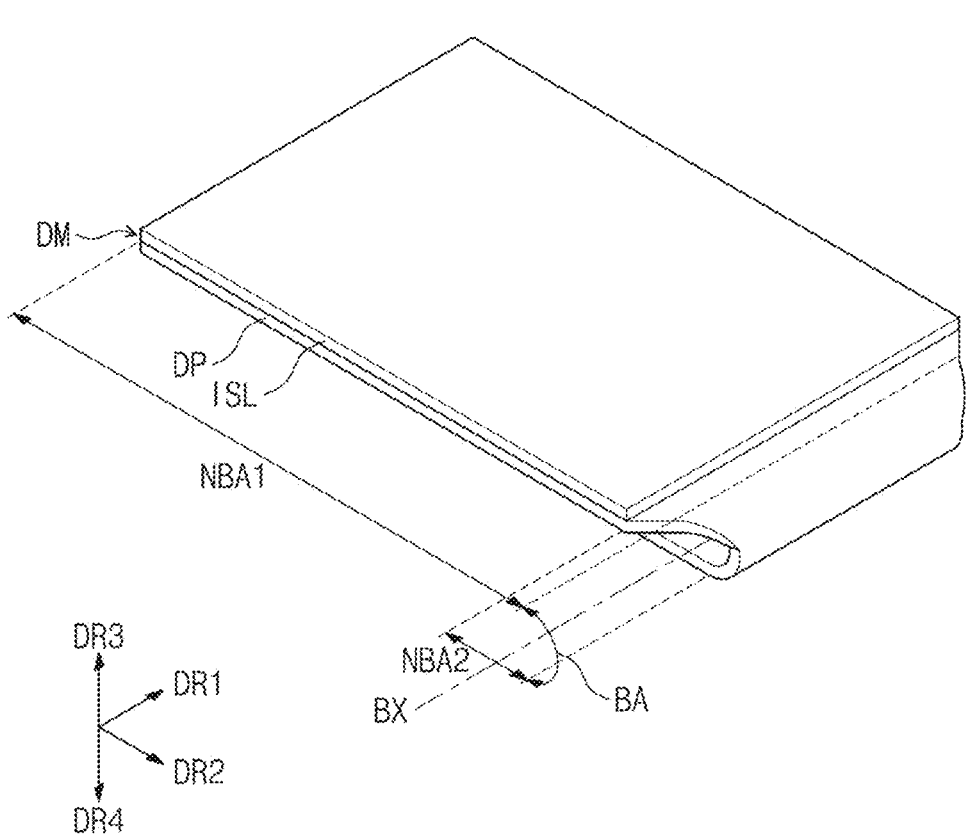
FIG. 2B is a perspective view showing a portion of a display device according to an embodiment of the invention.

FIG. 2B is a perspective view of the display module DM, and shows the display module DM in a bent state. More specifically, FIG. 2B shows a state in which the bending region BA of the display panel DP is bent, and the display panel DP may be included in the display device DD while being bent. The bending region BA may be bent based on a bending axis BX extended in parallel to the first direction axis DR1. In a state in which the bending region BA is bend, at least a portion of the second non-bending region NBA2 may overlap the first non-bending region NBA1.

Figure 3A:
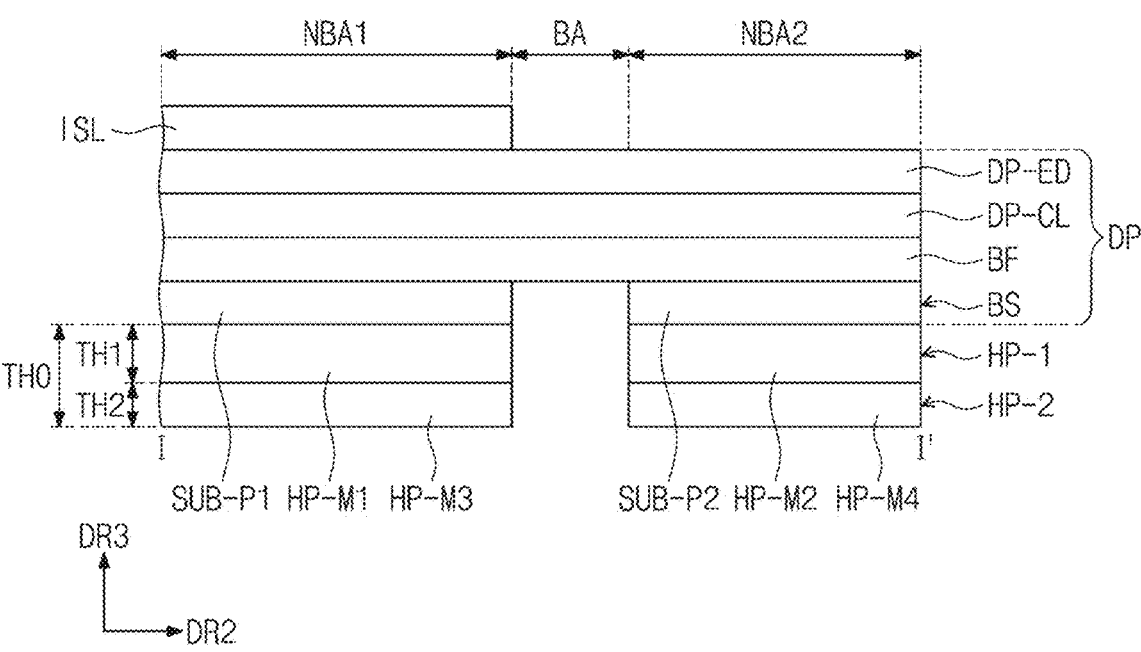
FIG. 3A to FIG. 3G are cross-sectional views of a display device according to an embodiment of the invention.

FIG. 3A is a cross-sectional view corresponding to a cross-section taken along line I-I' of FIG. 2A. Referring to FIG. 3A, an embodiment of the display panel DP may include a base layer BS, a circuit layer DP-CL disposed on the base layer BS, and a display element layer DP-ED disposed on the circuit layer DP-CL.

Figure 3B:
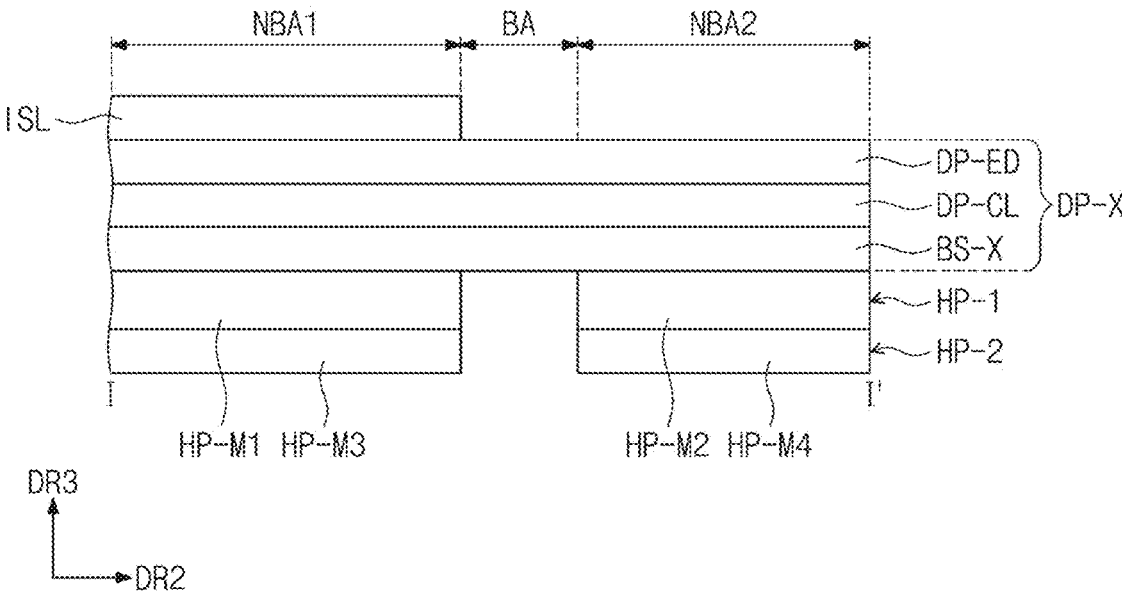
Figure 3C:
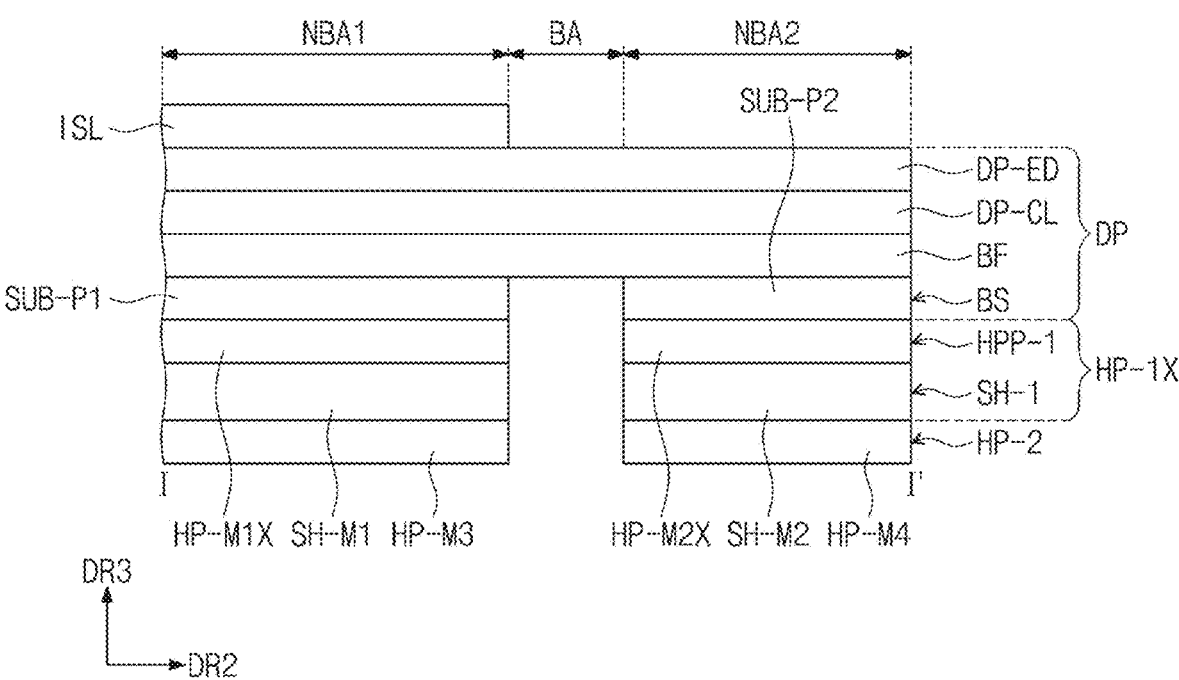
Figure 3D:
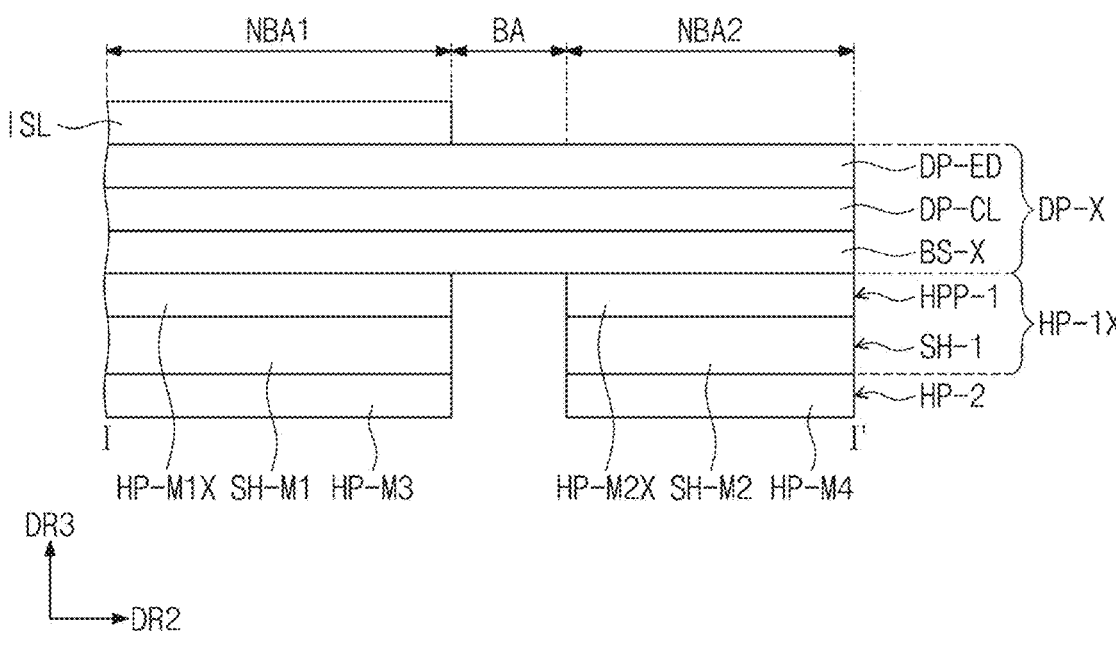
Figure 3E:
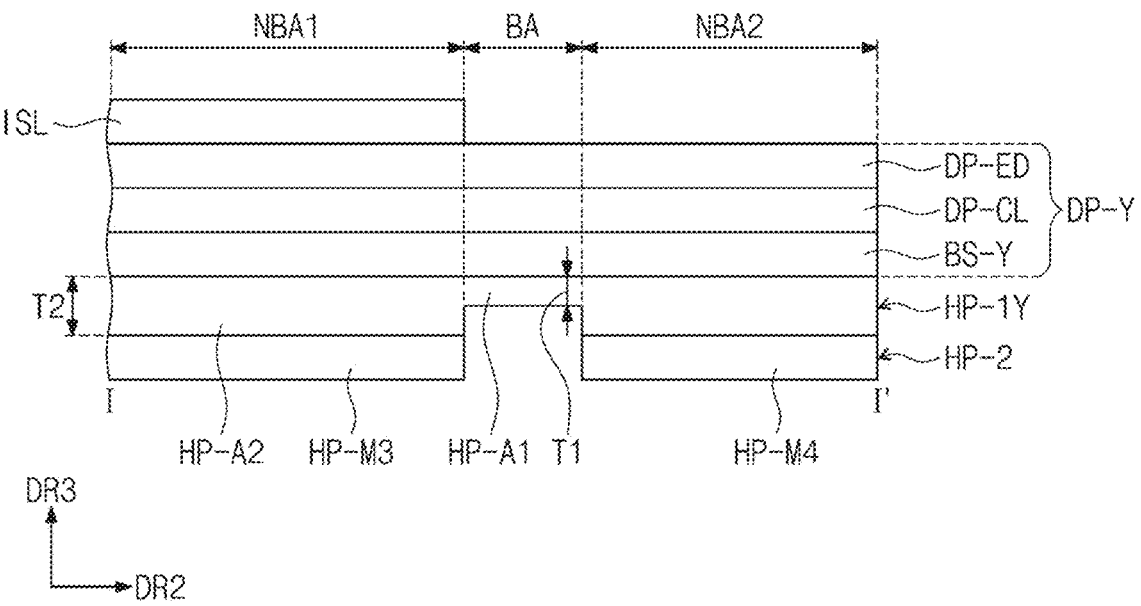
Figure 3F:
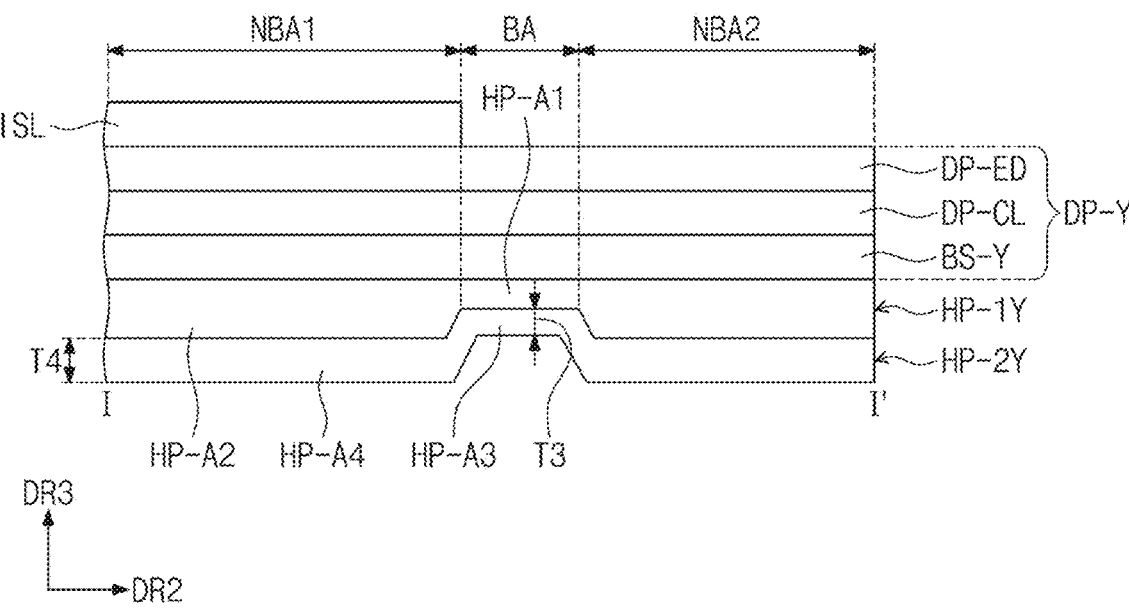
Figure 3G:
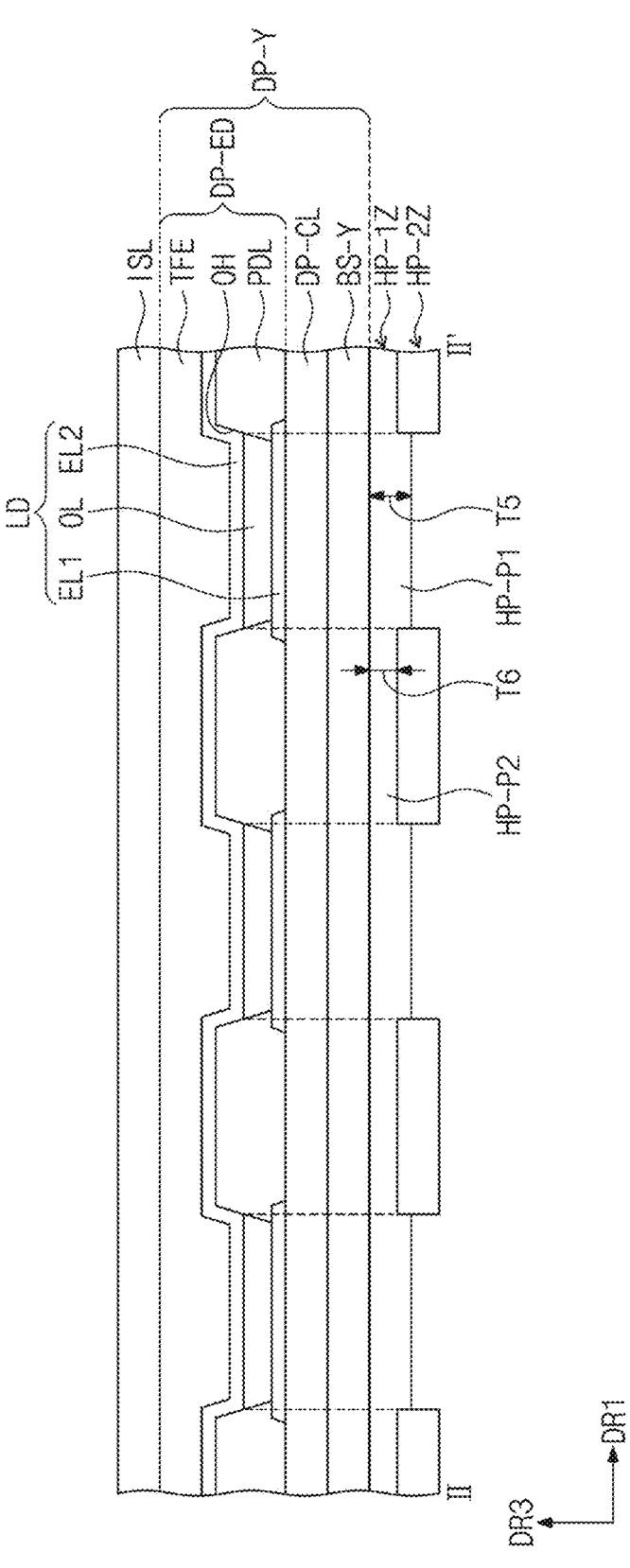

The display element layer DP-ED may include a light emitting element LD (see FIG. 3G). The display element layer DP-ED will be described with reference to FIG. 3G later. The circuit layer DP-CL may include an insulation layer, a semiconductor pattern, a conductive pattern, a signal line, and the like.

The base layer BS may be a member which provides a base surface on which the circuit layer DP-CL is disposed. The base layer BS may be a glass substrate, a metal substrate, or a plastic substrate.

In an embodiment shown in FIG. 3A, the base layer BS may be a glass substrate. In an embodiment, for example, the thickness of the base layer BS, which is a glass substrate, may be about 200 micrometers ($\mu$m). However, this is only exemplary, and the embodiment of the invention is not limited thereto.

The base layer BS, which is a glass substrate, may not overlap the bending region BA. The base layer BS may include a first glass substrate SUB-P1 overlapping the first non-bending region NBA1 and a second glass substrate SUB-P2 overlapping the second non-bending region NBA2.

In an embodiment, a buffer layer BF may be disposed on the base layer BS, which is a glass substrate, and the circuit layer DP-CL may be disposed on the buffer layer BF. The buffer layer BF may include a metal. In an embodiment, for example, the buffer layer BF may include aluminum, chromium, or titanium. In an embodiment of a method for manufacturing a display device to be described later, the buffer layer BF may serve as an etch stopper of the base layer BS.

In an embodiment, the first heat dissipation member HP-1 may be disposed on a first surface of the base layer BS. The first heat dissipation member HP-1 may be defined by a single layer or multiple layers. FIG. 3A illustrates an embodiment where the first heat dissipation member HP-1 is a single layer. The first heat dissipation plate HP-M1 of the first heat dissipation member HP-1 may be disposed on a first surface of the first glass substrate SUB-P1. The second heat dissipation plate HP-M2 of the first heat dissipation member HP-1 may be disposed on a first surface of the second glass substrate SUB-P2. Here, the first surface may be a lower surface.

in an embodiment, the second heat dissipation member HP-2 may be disposed on a first surface of the first heat dissipation member HP-1. The second heat dissipation member HP-2 may be defined by a single layer. The third heat dissipation plate HP-M3 of the second heat dissipation member HP-2 may be disposed on a first surface of the first heat dissipation plate HP-M1. The fourth heat dissipation plate HP-M4 of the second heat dissipation member HP-2 may be disposed on a first surface of the second heat dissipation plate HP-M2. That is, in the first non-bending region NBA1, the third heat dissipation plate HP-M3, the first heat dissipation plate MP-M1, and the first glass substrate SUB-P1 may be sequentially stacked in parallel to the direction in which the third direction axis DR3 is extended. In the second non-bending region NBA2, the fourth heat dissipation plate HP-M4, the second heat dissipation plate HP-M2, and the second glass substrate SUB-P2 may be sequentially stacked in parallel to the direction in which the third direction axis DR3 is extended.

The first heat dissipation member HP-1 may dissipate heat generated in the display panel DP and the like and adsorb an impact from the outside, thereby protecting components of the display panel DP and the like. In an embodiment, for example, the first heat dissipation member HP-1 may include at least one selected from a polyurethane resin and a polyethylene resin as the first polymer resin. In an embodiment, the first heat dissipation member HP-1 may include an acrylate resin as the first polymer resin. The heat dissipation member HP-1 of a single layer may include at least one selected from a polyurethane resin and a polyethylene resin, and an acrylate resin as the first polymer resin. The first heat dissipation member HP-1 including a polyurethane resin has properties of being flexible, and thus, may be suitable for a flexible device. The first heat dissipation member HP-1 may include at least one selected from reduced graphene oxide (RGO), carbon nanotube (CNT), copper, and aluminum as the first heat dissipation nano-particles.

The second heat dissipation member HP-2 may dissipate heat generated in the display panel DP and the like. In an embodiment, for example, the second heat dissipation member HP-2 may include at least one selected from a polyurethane resin and a polyethylene resin as the second polymer resin. The second heat dissipation member HP-2 including a polyurethane resin has properties of being flexible, and thus, may be suitable for a flexible device. The second heat dissipation member HP-2 may include at least one selected from reduced graphene oxide (RGO), carbon nanotube (CNT), copper, and aluminum as the second heat dissipation nano-particles.

The first polymer resin of the first heat dissipation member HP-1 and the second polymer resin of the second heat dissipation member HP-2 may be the same as or different from each other. The content of the first polymer resin in the first heat dissipation member HP-1 may be the same as or different from the content of the second polymer resin in the second heat dissipation member HP-2. The first heat dissipation nano-particles of the first heat dissipation member HP-1 and the second heat dissipation nano-particles of the second heat dissipation member HP-2 may be the same as or different from each other.

In an embodiment, a first weight of the first heat dissipation nano-particles in the first heat dissipation member HP-1 may be different from a second weight of the second heat dissipation nano-particles in the second heat dissipation member HP-2. The first weight means the weight of the first heat dissipation nano-particles based on the total weight of the first heat dissipation member HP-1, and the second weight means the weight of the second heat dissipation nano-particles based on the total weight of the second heat dissipation member HP-2.

In an embodiment, for example, the first weight of the first heat dissipation nano-particles in the first heat dissipation member HP-1 may be less than the second weight of the second heat dissipation nano-particles in the second heat dissipation member HP-2. In such an embodiment, the second heat dissipation member HP-2 may include heat dissipation nano-particles of a greater weight than that of heat dissipation nano-particles of the first heat dissipation member HP-1.

In the first heat dissipation member HP-1, the first weight of the first heat dissipation nano-particles may be in a range of about 0.1 wt % to about 30 wt %. More specifically, in the first heat dissipation member HP-1, the first weight of the first heat dissipation nano-particles may be in a range of about 10 wt % to about 30 wt %. In the second heat dissipation member HP-2, the second weight of the second heat dissipation nano-particles may be greater than about 50 wt %. More specifically, in the second heat dissipation member HP-2, the second weight of the second heat dissipation nano-particles may be about 60 wt % or greater. However, this is only exemplary, and in the first heat dissipation member HP-1 and the second heat dissipation member HP-2, the first weight of the first heat dissipation nano-particles and the second weight of the second heat dissipation nano-particles are not limited thereto.

The sum of thicknesses TH0 of the first heat dissipation member HP-1 and the second heat dissipation member HP-2 may be in a range of about 10 μm to about 500 μm. A thickness TH1 of the first heat dissipation member HP-1 may be greater than a thickness TH2 of the second heat dissipation member HP-2. In an embodiment, for example, the thickness TH1 of the first heat dissipation member HP-1 may be in a range of about 5 μm to about 300 μm. The thickness TH2 of the second heat dissipation member HP-2 may be in a range of about 5 μm to about 200 μm. However, this is only exemplary, and the thickness TH1 of the first heat dissipation member HP-1 and the thickness TH2 of the second heat dissipation member HP-2 are not limited thereto.

The first heat dissipation member HP-1 may have adhesion force in a range of about 50 gram force per inch (gf/inch) to about 2000 gf/inch with respect to the base layer BS. The second heat dissipation member HP-2 may have adhesion force in a range of about 50 gf/inch to about 2000 gf/inch with respect to the first heat dissipation member HP-1. The adhesion force of the first heat dissipation member HP-1 with respect to the base layer BS, and the adhesion force of the second heat dissipation member HP-2 with respect to the first heat dissipation member HP-1 may correspond to 180° peel force measured by ASTM D3330 method. More specifically, the 180° peel force may be measured under a rate condition of about 305 millimeters per minute (mm/min) using a sample having a width of about 1 inch and a length of about 18 centimeters (cm).

A first heat dissipation member and a second heat dissipation member having adhesion force of less than about 50 gf/inch may be peeled or damaged. A first heat dissipation member and a second heat dissipation member having adhesion force of greater than about 2000 gf/inch may not be suitable for a flexible device. The first heat dissipation member HP-1 and the second heat dissipation member HP-2 having adhesion force in a range of about 50 gf/inch to about 2000 gf/inch may exhibit high reliability.

Each of FIG. 3B to FIG. 3F is a cross-sectional view corresponding to a cross-section taken along line I-I' of FIG. 2A, and shows another embodiment of the invention. FIG. 3B illustrates an embodiment where a base layer BS-X of a display panel DP-X overlaps the first non-bending region NBA1, the bending region BA, and the second non-bending region NBA2.

In an embodiment shown in FIG. 3B, the base layer BS-X may be a plastic substrate. In an embodiment, for example, the base layer BS-X may be a polyimide substrate. In an embodiment, the circuit layer DP-CL and the display element layer DP-ED may be disposed on the base layer BS-X, which is a polyimide substrate.

in an embodiment, the first heat dissipation plate HP-M1 and the second heat dissipation plate HP-M2 may be disposed on a first surface of the base layer BS-X, which is a polyimide substrate. The first heat dissipation plate HP-M1 and the second heat dissipation plate HP-M2 may not overlap the bending region BA.

FIG. 3C illustrates an embodiment where a first heat dissipation member HP-1X has a multilayer structure or is defined by multiple layers. In an embodiment, the first heat dissipation member HP-1X may include a heat dissipation plate HPP-1 and an impact absorption layer SH-1 disposed on a first surface of the heat dissipation plate HPP-1. The heat dissipation plate HPP-1 may include a first heat dissipation plate HP-M1X and a second heat dissipation plate HP-M2X. The heat dissipation plate HPP-1 of the first heat dissipation member HP-1X may dissipate heat generated in a display panel DP and the like, and the impact absorption layer SH-1 of the first heat dissipation member HP-1X may protect components such as the display panel DP from an external impact.

The first heat dissipation plate HP-M1X of FIG. 3C may correspond to the first heat dissipation plate HP-M1 of FIG. 3A, and the second heat dissipation plate HP-M2X of FIG. 3C may correspond to the second heat dissipation plate HP-M2 of FIG. 3A. Each of the first heat dissipation plate HP-M1X and the second heat dissipation plate HP-M2X of FIG. 3C may include a first polymer resin and first heat dissipation nano-particles dispersed in the first polymer resin. The first heat dissipation plate HP-M1X and the second heat dissipation plate HP-M2X may include a same polymer resin as each other and a same heat dissipation nano-particles as each other. The first heat dissipation plate HP-M1X and the second heat dissipation plate HP-M2X may not include an acrylate resin.

In an embodiment where the first heat dissipation member HP-1X includes the heat dissipation plate HPP-1 and the impact absorption layer SH-1, the weight of first heat dissipation nano-particles included in the heat dissipation plate HPP-1 may be the same as or different from the weight of the second heat dissipation nano-particles included in the second heat dissipation member HP-2. In an embodiment, for example, the weight of the first heat dissipation nano-particles in the heat dissipation plate HPP-1 may be less than the weight of the second heat dissipation nano-particles in the second heat dissipation member HP-2. Alternatively, the weight of the first heat dissipation nano-particles in the heat dissipation plate HPP-1 may be greater than the weight of the second heat dissipation nano-particles in the second heat dissipation member HP-2. In another alternative embodiment, the weight of the first heat dissipation nano-particles in the heat dissipation plate HPP-1 may be the same as the weight of the second heat dissipation nano-particles in the second heat dissipation member HP-2.

The impact absorption layer SH-1 may include an acrylate resin to be photocured by light, and may not include heat dissipation nano-particles. In an embodiment, for example, the impact absorption layer SH-1 may include at least one selected from silicone acrylate and epoxy acrylate. The impact absorption layer SH-1 including an acrylate resin to be photocured by light may absorb an impact from the outside, thereby protecting components such as the display panel DP disposed on the impact absorption layer SH-1. The storage modulus of the impact absorption layer SH-1 may be about 100 megapascals (MPa) or less. The storage modulus of the impact absorption layer SH-1 may be measured at about 25° C. by ASTM D 695 method. The impact absorption layer SH-1 having a storage modulus of about 100 MPa or less may be suitable for a flexible device.

The impact absorption layer SH-1 may not overlap the bending region BA. The impact absorption layer SH-1 may include a first impact absorption part SH-M1 overlapping the first non-bending region NBA1 and a second impact absorption part SH-M2 overlapping the second non-bending region NBA2. In an embodiment, the second heat dissipation member HP-2 may be disposed on a first surface of the impact absorption layer SH-1.

The first impact absorption part SH-M1 may be disposed between the first heat dissipation plate HP-M1X and the third heat dissipation plate HP-M3, and the second impact absorption part SH-M2 may be disposed between the second heat dissipation plate HP-M2X and the fourth heat dissipation plate HP-M4. The thickness of the impact absorption layer SH-1 may be greater than the thickness of the heat dissipation plate HPP-1 and the thickness of the second heat dissipation member HP-2. The thickness of the heat dissipation plate HPP-1 and the thickness of the second heat dissipation member HP-2 may substantially the same as each other.

FIG. 3D illustrates an embodiment where the base layer BS-X of the display panel DP-X overlaps the bending region BA, the first non-bending region NBA1, and the second non-bending region NBA2, and the first heat dissipation member HP-1X is defined by multiple layers. In FIG. 3D, the first heat dissipation member HP-1X of FIG. 3C may be disposed on the first surface of the base layer BS-X of FIG. 3B.

In an embodiment shown in FIG. 3D, the base layer BS-X may be a polyimide substrate. In such an embodiment, the first heat dissipation plate HP-M1X and the second heat dissipation plate HP-M2X may be disposed on the first surface of the base layer BS-X. The first impact absorption part SH-M1 may be disposed on a first surface of the first heat dissipation plate HP-M1X, and the third heat dissipation plate HP-M3 may be disposed on a first surface of the first impact absorption part SH-M1. The second impact absorption part SH-M2 may be disposed on a first surface of the second heat dissipation plate HP-M2X, and the fourth heat dissipation plate HP-M4 may be disposed on a first surface of the second impact absorption part SH-M2.

FIG. 3E illustrates an embodiment where a first heat dissipation member HP-1Y overlaps the bending region BA. The first heat dissipation member HP-1Y may entirely overlap a base layer BS-Y of a display panel DP-Y.

In an embodiment, the first heat dissipation member HP-1Y may include a first region HP-A1 overlapping the bending region BA, and a second region HP-A2 not overlapping the bending region BA but overlapping the first non-bending region NBA1 and the second non-bending region NBA2. The first heat dissipation member HP-1Y has a first thickness T1 in the first region HP-A1 and has a second thickness T2 in the second region HP-A2, and the second thickness T2 may be greater than the first thickness T1. That is, the first heat dissipation member HP-TY may have the second thickness T2, which is thick, in the non-bending regions NBA1 and NBA2, and may have the first thickness T1, which is thin, in the bending region BA. The first heat dissipation member HP-TY in which the first thickness T1 in the bending region BA is less than the second thickness T2 in the non-bending regions NBA1 and NBA2 may exhibit properties of being easily bent.

The base layer BS-Y disposed on the first heat dissipation member HP-1Y may be a glass substrate or a polyimide substrate. In an embodiment where the base layer BS-Y is a glass substrate, the glass substrate may be bendable.

in an embodiment, the second heat dissipation member HP-2 may be disposed under (e.g., on a first or lower surface of) the first heat dissipation member HP-1Y. The second heat dissipation member HP-2 may include the third heat dissipation plate HP-M3 and the fourth heat dissipation plate HP-M4 which overlap the second region HP-A2 of the first heat dissipation member HP-1Y.

FIG. 3F illustrates an embodiment where a second heat dissipation member HP-2Y overlaps the bending region BA. Referring to FIG. 3F, the first heat dissipation member HP-1T may entirely overlap the base layer BS-Y, and the second heat dissipation member HP-2Y may entirely overlap the first heat dissipation member HP-1Y. The first heat dissipation member HP-1Y may include the first region HP-A1 overlapping the bending region BA, and the second region HP-A2 not overlapping the bending region BA but overlapping the non-bending regions NBA1 and NBA2.

In an embodiment, the second heat dissipation member HP-2Y may include a third region HP-A3 overlapping the bending region BA, and a fourth region HP-A4 not overlapping the bending region BA but overlapping the non-bending regions NBA1 and NBA2. The second heat dissipation member HP-2Y has a third thickness T3 in the third region HP-A3 and has a fourth thickness T4 in the fourth region HP-A4, and the fourth thickness T4 may be greater than the third thickness T3. That is, the second heat dissipation member HP-2Y may have the third thickness T3, which is thin, in the bending region BA, and may have the fourth thickness T4, which is thick, in the non-bending regions NBA1 and NBA2. The second heat dissipation member HP-2 in which the third thickness T3 in the bending region BA is less than the fourth thickness T4 in the non-bending regions NBA1 and NBA2 may exhibit properties of being easily bent.

In an embodiment, the first heat dissipation member HP-TY may be disposed on the second heat dissipation member HP-2Y, and the base layer BS-Y may be disposed on the first dissipation member HP-TY. The first heat dissipation member HP-1Y and the base layer BS-Y of FIG. 3F are substantially the same as those described with reference to FIG. 3E.

FIG. 3G is a cross-sectional view corresponding to a cross-section taken along line II-II' of FIG. 2A. Referring to FIG. 3G, an embodiment of the display element layer DP-ED may include pixel definition layers PDL and the light emitting element LD. An opening OH may be defined by the pixel definition layers PDL.

The light emitting element LD may include a first electrode EL1 disposed on the circuit layer DP-CL, a light emitting layer OL disposed on the first electrode EL1, and a second electrode EL2 disposed on the light emitting layer OL. The light emitting layer OL may be disposed in the opening OH.

In an embodiment, the base layer BS-Y may be disposed under the circuit layer DP-CL, and a first heat dissipation member HP-1Z may be disposed under the base layer BS-Y. in such an embodiment, a second heat dissipation member HP-2Z may be disposed under the first heat dissipation member HP-1Z. The base layer BS-Y may be a glass substrate or a polyimide substrate.

The first heat dissipation member HP-1Z may include a first portion HP-P1 overlapping the light emitting layer OL and a second portion HP-P2 not overlapping the light emitting layer OL. The first portion HP-P1 of the first heat dissipation member HP-1Z has a fifth thickness T5, and the second portion HP-P2 of the first heat dissipation member HP-1Z has a sixth thickness T6, where the sixth thickness T6 may be less than the fifth thickness T5. That is, the first heat dissipation member HP-1Z may have the fifth thickness T5, which is thick, in the first portion HP-P1 overlapping the light emitting layer OL, and may have the sixth thickness T6, which is thin, in the second portion HP-P2 not overlapping the light emitting layer OL. In such an embodiment, the first portion HP-P1 overlapping the light emitting layer OL may have a greater amount of generated heat compared to the second portion HP-P2 not overlapping the light emitting layer OL. The greater the thickness of the first heat dissipation member HP-1Z, the better the heat dissipation performance thereof. Accordingly, the first heat dissipation member HP-1Z having the fifth thickness T5, which is thick, in the first portion HP-P1 overlapping the light emitting layer OL may have improved reliability.

The second heat dissipation member HP-2Z may not overlap the light emitting layer OL. That is, the second heat dissipation member HP-2Z may be disposed only in a region not overlapping the light emitting layer OL. Although not illustrated, the second heat dissipation member HP-2Z may be provided to be thin in a region not overlapping the light emitting layer OL, and may be provided to be thick in a region overlapping the light emitting layer OL.

In an embodiment, the first electrode EL1 of the light emitting element LD may be a transmissive electrode, transflective electrode, or reflective electrode. In an embodiment where the first electrode EL1 is a transmissive electrode, the first electrode EL1 may include a transparent metal oxide, for example, indium tin oxide (ITO), indium zinc oxide (IZO), zinc oxide (ZnO), indium tin zinc oxide (ITZO), or the like. In an embodiment where the first electrode EL1 is a transflective electrode or reflective electrode, the first electrode EL1 may include Ag, Mg, Cu, Al, Pt, Pd, Au, Ni, Nd, Ir, Cr, Li, Ca, LiF/Ca (stacking structure of LiF and Ca), LiF/Al (stacking structure of LiF and Al), Mo, Ti, W, or a compound or mixture thereof (for example, a mixture of Ag and Mg).

Alternatively, the first electrode EL1 may have a multi-layered structure including a reflective film or transflective film including or formed of at least one selected from the above exemplified materials, and a transparent conductive film including or formed of indium tin oxide (ITO), indium zinc oxide (IZO), zinc oxide (ZnO), indium tin zinc oxide (ITZO), or the like. In an embodiment, for example, the first electrode EL1 may have a three-layered structure of ITO/Ag/ITO, but is not limited thereto.

The pixel definition layer PDL may cover a portion of the first electrode EL1. The openings OH defined in the pixel definition layer PDL may expose a portion of the first electrode EL1.

The light emitting layer OL may include an inorganic light emitting material, or an organic light emitting material. In an embodiment, for example, the light emitting layer OL may include a host and a dopant. In an embodiment, the light emitting layer OL may include a quantum dot. However, this is only exemplary, and materials included in the light emitting layer OL are not limited thereto.

The second electrode EL2 may be a common electrode. The second electrode EL2 may be a transmissive electrode, transflective electrode, or reflective electrode. In an embodiment where the second electrode EL2 is a transmissive electrode, the second electrode EL2 may include or be formed of a transparent metal oxide, for example, indium tin oxide (ITO), indium zinc oxide (IZO), zinc oxide (ZnO), indium tin zinc oxide (ITZO), or the like.

In an embodiment where the second electrode EL2 is a transflective electrode or reflective electrode, the second electrode EL2 may include Ag, Mg, Cu, Al, Pt, Pd, Au, Ni, Nd, Ir, Cr, Li, Ca, LiF/Ca, LiF/Al, Mo, Ti, Yb, W, or a compound or a mixture thereof (for example, AgMg, AgYb, or MgYb). Alternatively, the second electrode EL2 may have a multi-layered structure including a reflective film or transflective film including or formed of at least one selected from the above exemplified materials, and a transparent conductive film including or formed of indium tin oxide (ITO), indium zinc oxide (IZO), zinc oxide (ZnO), indium tin zinc oxide (ITZO), or the like.

Although not illustrated, at least one selected from a hole injection layer, a hole transport layer, and an electron blocking layer may be disposed between the first electrode EL1 and the light emitting layer OL. In an embodiment, at least one selected from a hole blocking layer, an electron transport layer, and an electron injection layer may be disposed between the light emitting layer OL and the second electrode EL2.

The display element layer DP-ED may include an encapsulation layer TFE disposed on the second electrode EL2. The encapsulation layer TFE may cover the light emitting element LD. The encapsulation layer TFE may include at least one organic layer and at least one inorganic layer. In an embodiment, the input sensing layer ISL may be disposed on the encapsulation layer TFE.

Figure 4A:
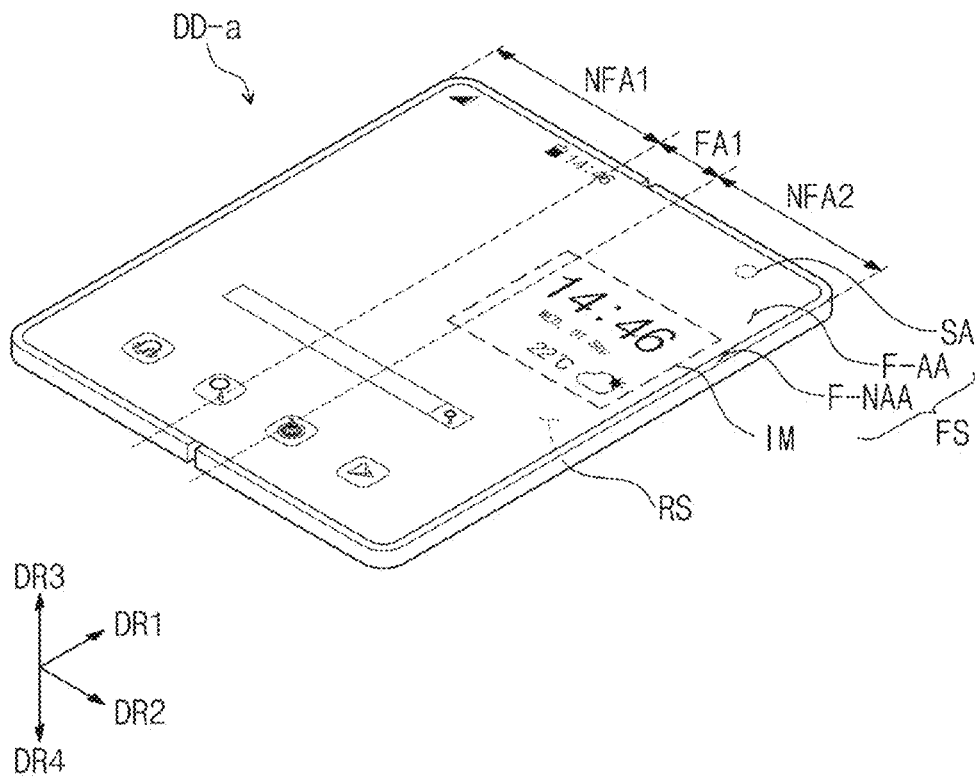
FIG. 4A is a perspective view showing a display device of an embodiment of the invention.
Figure 4B:
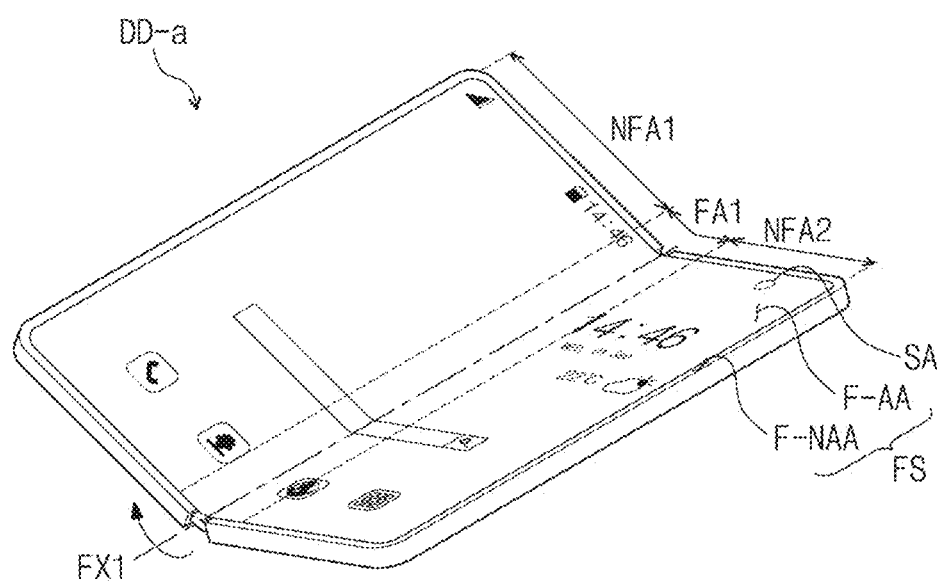
FIG. 4B is a perspective view showing a display device of an embodiment of the invention.
Figure 4B:
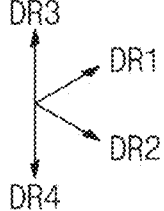
Figure 4C:
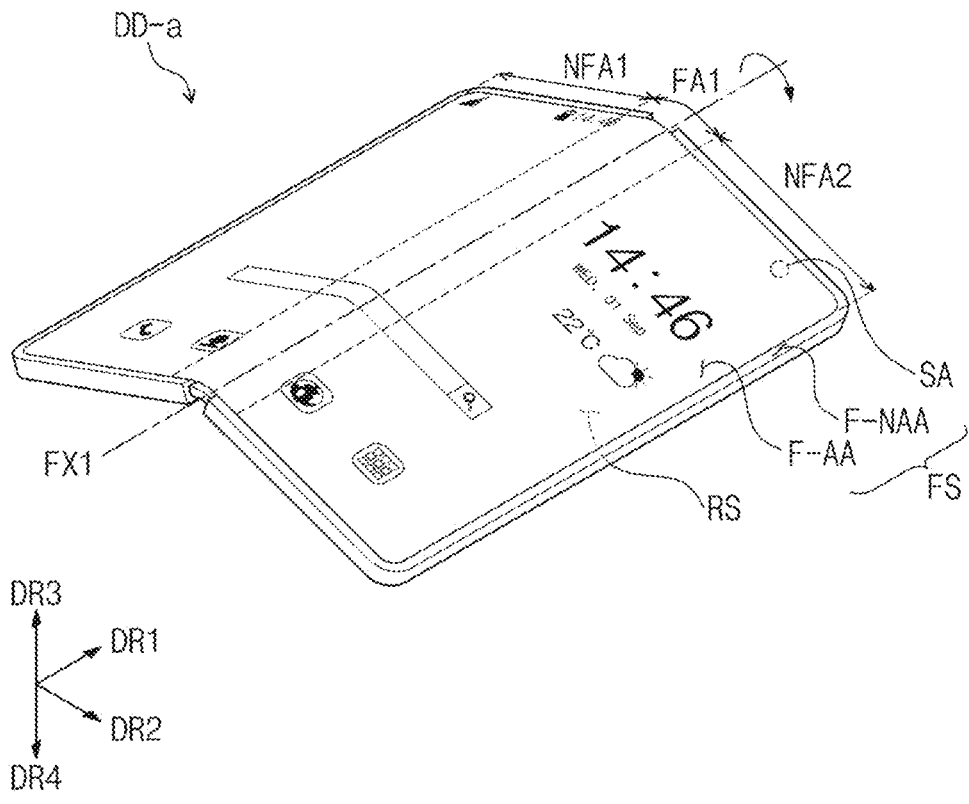
FIG. 4C is a perspective view showing a display device of an embodiment of the invention.

FIG. 4A shows an alternative embodiment of the invention, and is a perspective view of a foldable display device. FIG. 4B is a perspective view showing an inner-folding process of the display device illustrated in FIG. 4A. FIG. 4C is a perspective view showing an outer-folding process of the display device illustrated in FIG. 4A.

Referring to FIG. 4A to FIG. 4C, an embodiment of a display device DD-a may include a display surface FS defined by the first direction axis DR1 and the second direction axis DR2 crossing the first direction axis DR1. The display device DD-a may provide an image IM to a user through the display surface FS.

The display surface FS may include an active region F-AA and a peripheral region F-NAA. The active region F-AA may be a region activated based on an electrical signal. The display device DD-a may display the image IM through the active region F-AA. In addition, various forms of external inputs may be sensed in the active region F-AA. The peripheral region F-NAA may be adjacent to the active region F-AA. The peripheral region F-NAA may surround the active region F-AA. Accordingly, the shape of the active region F-AA may substantially be defined by the peripheral region F-NAA. However, this is only exemplarily illustrated, and the peripheral region F-NAA may be disposed adjacent to only one side of the active region F-AA, or may be omitted.

The active region F-AA may include a sensing region SA. The sensing region SA may have various electronic modules disposed therein. In an embodiment, for example, an electronic module may include at least one selected from a camera module, a speaker, a light sensing sensor, and a heat sensing sensor. The sensing region SA may sense an external object received through the display surface FS, or may provide a sound signal such as voice to the outside through the display surface FS. The electronic module may include a plurality of components, and is not limited to any one embodiment.

The sensing region SA may be surrounded by the active region F-AA and the peripheral region F-NAA. In an embodiment, for example, the sensing region SA may be disposed in the active region F-AA, and the disposition of the sensing region SA is not limited to any one embodiment. FIG. 4A and the like exemplarily illustrate an embodiment including a single sensing region SA, but the number of the sensing region SA is not limited thereto.

A rear surface RS of the display device DD-a may be a surface facing the display surface FS. In an embodiment, for example, the rear surface RS may be an external surface of the display device DD-a, and a video or an image may not be displayed thereon. Alternatively, the rear surface RS may function as a second display surface on which a video or an image is displayed. In an embodiment, the display device DD-a may further include a sensing region disposed on the rear surface RS. A camera, a speaker, a light sensing sensor, or the like may also be disposed in the sensing region disposed on the rear surface RS.

The display device DD-a may include a folding region FA1 and non-folding regions NFA1 and NFA2. The display device DD-a may include a plurality of non-folding regions NFA1 and NFA2. The display device DD-a may include a first non-folding region NFA1 and a second non-folding region NFA2 spaced apart from each other with the folding region FA1 interposed therebetween.

FIG. 4A to FIG. 4C illustrate an embodiment of the display device DD-a including a single folding region FA1, but this is only exemplary, and the display device DD-a may have a plurality of folding regions. In addition, the display device DD-a may be folded on the basis of a plurality of folding axes such that portions of the display surface FS may be folded to face each other, and the number of folding axes and the number of non-folding regions in accordance therewith are not limited.

Referring to FIG. 4B and FIG. 4C, the display device DD-a may be folded on the basis of a first folding axis FX1. The first folding axis FX1 illustrated in FIG. 4B and FIG. 4C is an imaginary axis extended in the first direction axis DR1, and the first folding axis FX1 may be parallel to a long side direction of the display device DD-a. However, this is only exemplary, and an extension direction of the first folding axis FX1 is not limited to the first direction axis DR1.

The first folding axis FX1 may be extended along the first direction axis DR1 on the display surface FS, or may be extended along the first direction axis DR1 in a lower portion of the rear surface RS. Referring to FIG. 4B, in an embodiment, the first non-folding region NFA1 and the second non-folding region NFA2 may face each other, and the display device DD-a may be inner-folded such that the display surface FS is not exposed to the outside. In addition, referring to FIG. 4C, the display device DD-a may be folded on the basis of the first folding axis FX1 and transformed into an outer-folded state in which, in the rear surface RS, one region overlapping the first non-folding region NFA1 and the other region overlapping the second non-folding region NFA2 face each other.

FIG. 4A is a perspective view showing a display device according to an embodiment in an unfolded state. FIG. 4B is a perspective view showing an inner-folding process of the display device illustrated in FIG. 4A.

Figure 5:
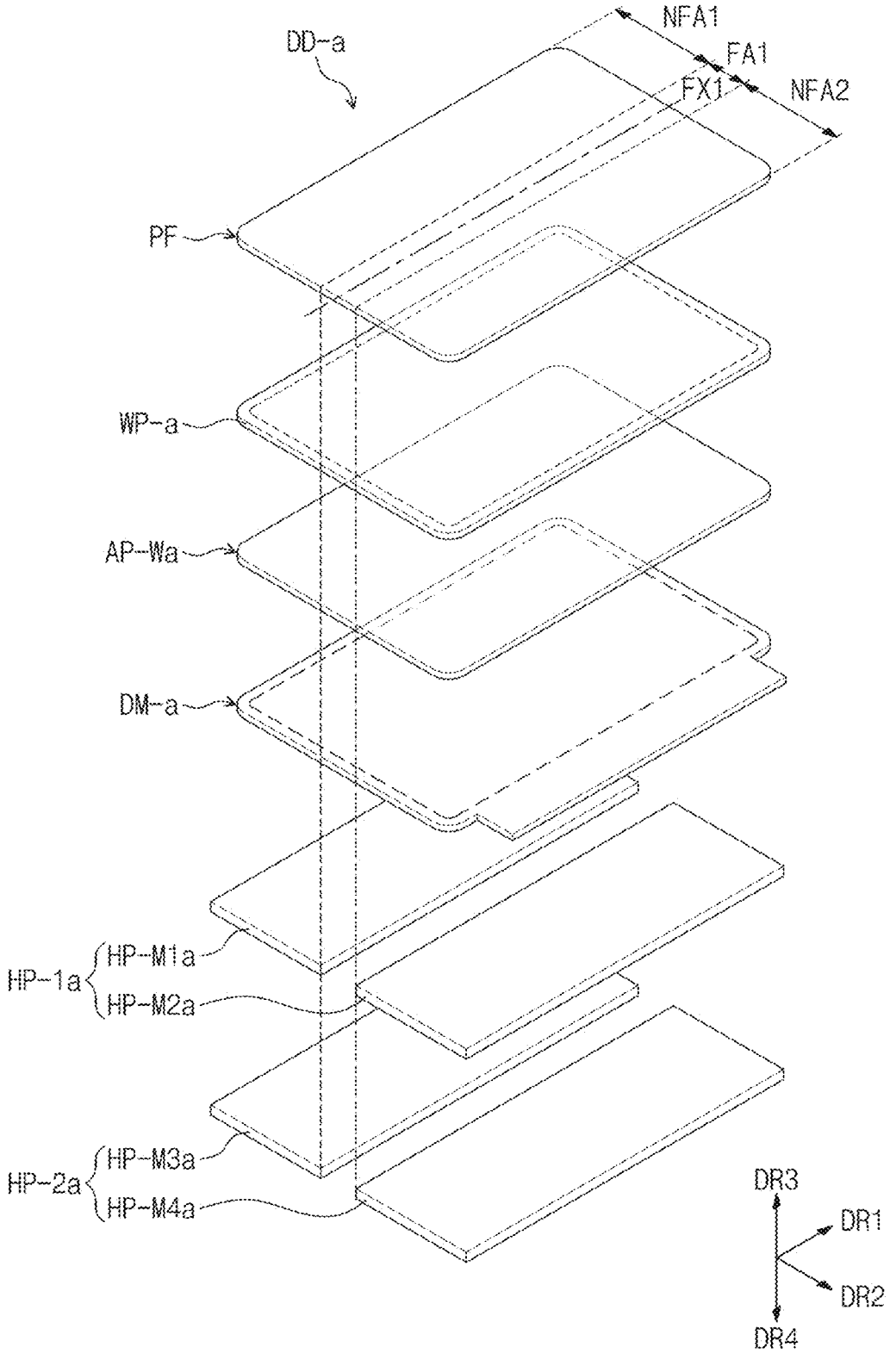
FIG. 5 is an exploded perspective view showing a display device of an embodiment of the invention.

FIG. 5 is an exploded perspective view of the display device DD-a illustrated in FIG. 4A. An embodiment of the display device DD-a may include a display module DM-a, and heat dissipation members HP-1a and HP-2a disposed below (or on a lower surface of) the display module DM-a. In such an embodiment, the display device DD-a may include a window adhesive layer AP-Wa disposed on the display module DM-a, a window WP-a disposed on the window adhesive layer AP-Wa, and a protective layer PF disposed on the window WP-a.

The protective layer PF may be a functional layer which protects a second surface of the window WP-a. The second surface of the window WP-a may be adjacent to the protective layer PF, and a first surface of the window WP-a may be adjacent to the window adhesive layer AP-Wa. The protective layer PF may include an anti-fingerprint coating agent, a hard coating agent, an anti-static agent, and the like. Although not illustrated, a protective layer adhesive layer may be disposed between the window WP-a and the protective layer PF.

The window WP-a and the display module DM-a may be coupled to each other by the window adhesive layer AP-Wa. The window adhesive layer AP-Wa may include a typical adhesive such as a pressure sensitive adhesive (PSA), an optically clear adhesive (OCA), or an optically clear resin (OCR), but is not limited to any one embodiment.

The display module DM-a may include any one of the display panels DP or DP-X illustrated in FIG. 3A to FIG. 3D, and the input sensing layer ISL disposed on the display panel DP or DP-X. In an embodiment, a first heat dissipation member HP-1a may be disposed below the display module DM-a, and a second heat dissipation member HP-2a may be disposed below the first heat dissipation member HP-1a.

The first heat dissipation member HP-1a may include a first polymer resin and first heat dissipation nano-particles dispersed in the first polymer resin. The first heat dissipation member HP-1a may not overlap the folding region FA1. The first heat dissipation member HP-1a may include a first heat dissipation plate HP-M1a and a second heat dissipation plate HP-M2a spaced apart from each other with the folding region FA1 interposed therebetween. In a state where the display device DD-a is not folded as shown in FIG. 4A, the first heat dissipation plate HP-M1a may overlap the first non-folding region NFA1, and the second heat dissipation plate HP-M2a may overlap the second non-folding region NFA2.

The second heat dissipation member HP-2a may include a second polymer resin and second heat dissipation nano-particles dispersed in the second polymer resin. The second heat dissipation member HP-2a may not overlap the folding region FA1. The second heat dissipation member HP-2a may include a third heat dissipation plate HP-M3a and a fourth heat dissipation plate HP-M4a spaced apart from each other with the folding region FA1 interposed therebetween. In a state where the display device DD-a is not folded as shown in FIG. 4A, the third heat dissipation plate HP-M3a may overlap the first non-folding region NFA1, and the fourth heat dissipation plate HP-M4a may overlap the second non-folding region NFA2.

In an embodiment of the foldable display device DD-a, the number of heat dissipation plates included in the first heat dissipation member HP-1a and the number of heat dissipation plates included in the second heat dissipation member HP-2a may correspond to the number of non-folding regions. In an embodiment, for example, where a display device includes three or more non-folding regions, a first heat dissipation member may include three or more heat dissipation plates, and a second heat dissipation member may include three or more heat dissipation plates.

In an embodiment of the foldable display device DD-a, at least one selected from a first heat dissipation member and a second heat dissipation member may be provided to overlap the folding region FA1 and the non-folding regions NFA1 and NFA2. In an embodiment of the foldable display device DD-a, for example, as similar to that is illustrated in FIG. 3E and FIG. 3F, the first heat dissipation member may have different thicknesses in a region overlapping the folding region FA1 and in a region overlapping the non-folding regions NFA1 and NFA2.

In an embodiment, where the first heat dissipation member overlaps the folding region FA1 and the non-folding regions NFA1 and NFA2, in the first heat dissipation member, a region overlapping the folding region FA1 may be formed to be thin, and a region overlapping the non-folding regions NFA1 and NFA2 may be formed to be thick. In an embodiment of the foldable display device DD-a, where the second heat dissipation member overlaps the folding region FA1 and the non-folding regions NFA1 and NFA2, in the second heat dissipation member, a region overlapping the folding region FA1 may be formed to be thin, and a region overlapping the non-folding regions NFA1 and NFA2 may be formed to be thick.

Figure 6:
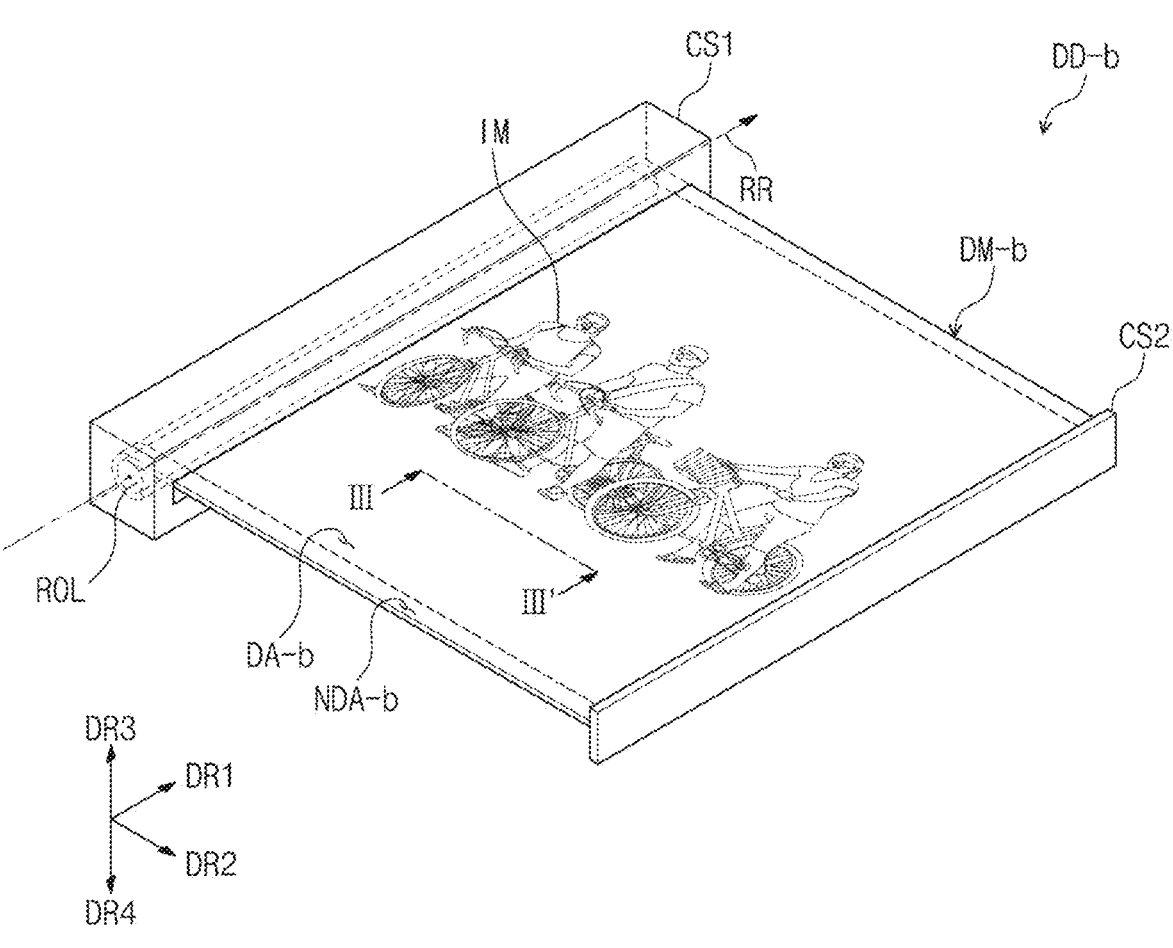
FIG. 6 is a perspective view showing a display device of an embodiment of the invention.

FIG. 6 shows another alternative embodiment of the invention, and is a perspective view of a rollable display device DD-b. In an embodiment, the display device DD-b may include a roller ROL and a display module DM-b coupled to the roller ROL. The roller ROL may rotate along a rolling axis RR extended in parallel to the first direction axis DR1. As the roller ROL rotates, the display module DM-b may be wound or unwound.

The display device DD-b may include a display region DA-b and a non-display region NDA-b adjacent to the display region DA-b. The display device DD-b may display an image IM through the display region DA-b. The non-display region NDA-b may be a region in which the image IM is not displayed. However, the embodiment of the invention is not limited thereto, and alternatively, the non-display region NDA-b may be omitted.

The display device DD-b may include a first case part CS1 and a second case part CS2. The first case part CST may be a portion in which the roller ROL is received. The second case part CS2 may be a handle part coupled to an end of the display module DM-b. The second case part CS2 moves in parallel to the direction in which the second direction axis DR2 is extended, and the display module DM-b may be wound or unwound based on the movement of the second case part CS2.

Figure 7A:
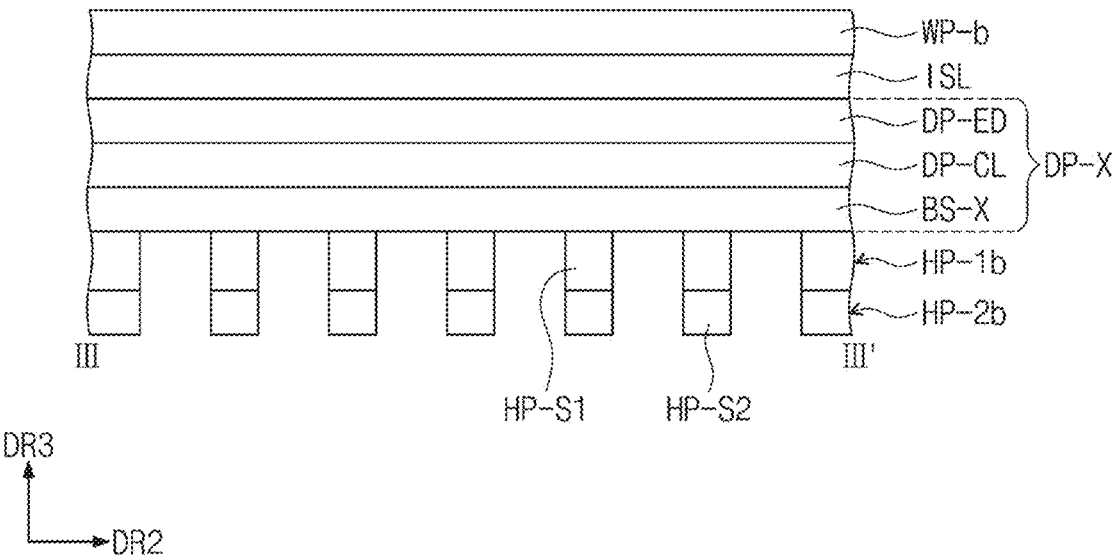
FIG. 7A is a cross-sectional view of a display device according to an embodiment of the invention.
Figure 7B:
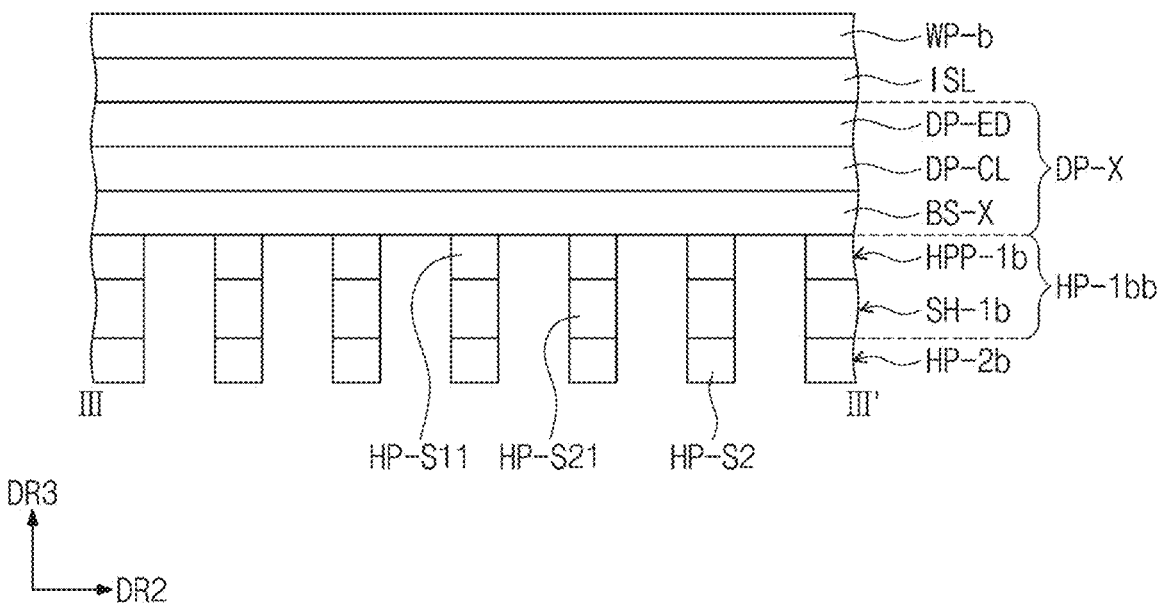
FIG. 7B is a cross-sectional view of a display device according to an embodiment of the invention.

FIG. 7A and FIG. 7B are cross-sectional views corresponding to a cross-section taken along line III-III' of FIG. 6. Referring to FIG. 7A, an embodiment of the display device DD-b may include a display panel DP-X, and heat dissipation members HP-1b and HP-2b disposed under the display panel DP-X. In such an embodiment, the display device DD-b may include an input sensing layer ISL and a protective member WP-b disposed on the display panel DP-X.

The display panel DP-X may include a base layer BS-X, a circuit layer DP-CL disposed on the base layer BS-X, and a display element layer DP-ED disposed on the circuit layer DP-CL. In such an embodiment, features of the display panel DP-X may be substantially the same as those described above with reference to the display panel DP-X of FIG. 3D.

In such an embodiment, the features of the input sensing layer ISL may be substantially the same as those described above with reference to the input sensing layer ISL of FIG. 2A. The protective member WP-b may protect components such as the display panel DP-X disposed under the protective member WP-b. In an embodiment, for example, the protective member WP-b may include an anti-fingerprint coating agent, a hard coating agent, and the like.

In an embodiment, a first heat dissipation member HP-1b may be disposed under the display panel DP-X, and a second heat dissipation member HP-2b may be disposed under the first heat dissipation member HP-1b. The first heat dissipation member HP-1b may include a first polymer resin and first heat dissipation nano-particles, and the second heat dissipation member HP-2b may include a second polymer resin and second heat dissipation nano-particles.

The first heat dissipation member HP-1b may include a plurality of first heat dissipation sticks HP-S1 spaced apart in the direction in which the second direction axis DR2 is extended. FIG. 7A illustrates an embodiment where gaps at which the first heat dissipation sticks HP-S1 are spaced apart in the direction in which the second direction axis DR2 is extended (i.e., the direction of the second direction axis DR2) are the same as each other, but the embodiment of the invention is not limited thereto. In an alternative embodiment, the gaps at which the first heat dissipation sticks HP-S1 are spaced apart in the direction in which the second direction axis DR2 is extended may be different from each other.

The second heat dissipation member HP-2b may include a plurality of second heat dissipation sticks HP-S2 spaced apart in the direction in which the second direction axis DR2 is extended. FIG. 7A illustrates an embodiment where gaps at which the second heat dissipation sticks HP-S2 are spaced apart in the direction in which the second direction axis DR2 is extended are the same as each other, but the embodiment of the invention is not limited thereto. In an alternative embodiment, the gaps at which the second heat dissipation sticks HP-S2 are spaced apart in the direction in which the second direction axis DR2 is extended may be different from each other. In the direction in which the second direction axis DR2 is extended, the gaps at which the first heat dissipation sticks HP-S1 are spaced apart and the gaps at which the second heat dissipation sticks HP-S2 are spaced apart may be the same as each other.

FIG. 7B illustrates an alternative embodiment where a first heat dissipation member HP-1bb includes a heat dissipation layer HPP-1b and an impact absorption layer SH-1b disposed under the heat dissipation layer HPP-1b. In such an embodiment, as shown in FIG. 7B, the heat dissipation layer HPP-1b includes a plurality of first heat dissipation sticks HP-S11, and the impact absorption layer SH-1b includes impact absorption sticks HP-S21 disposed under the first heat dissipation sticks HP-S11.

In an embodiment, as shown in FIG. 7B, each of the first heat dissipation sticks HP-S11 may include a first polymer resin and first heat dissipation nano-particles dispersed in the first polymer resin. Each of the impact absorption sticks HP-S21 may include a photo-curable acrylate resin, and may not include heat dissipation nano-particles. The impact absorption sticks HP-S21 may absorb an impact, thereby protecting components such as the display panel DP-X disposed thereon.

Figure 8A:
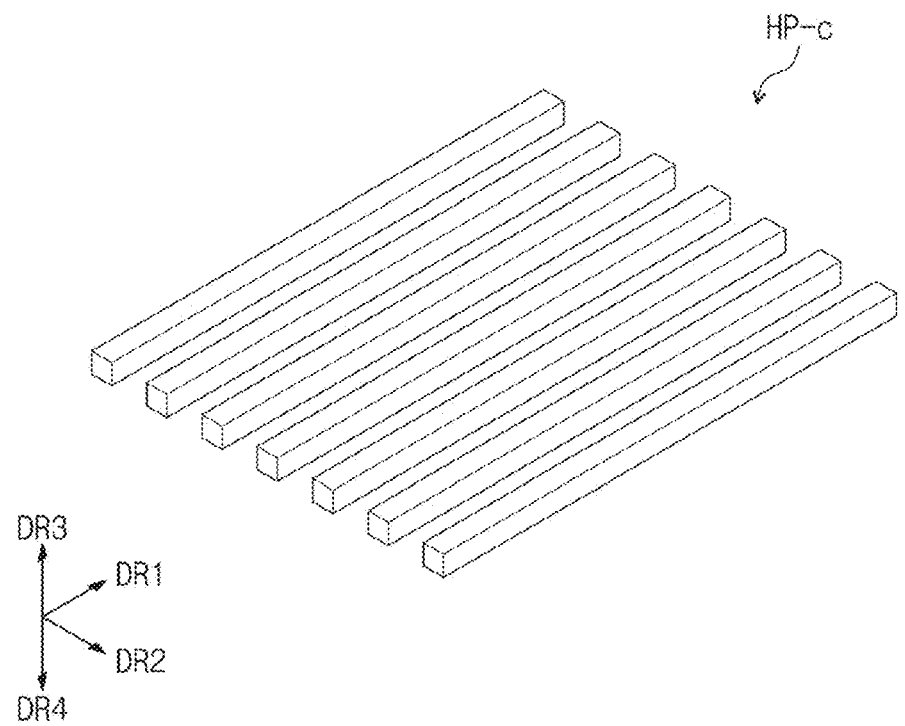
FIG. 8A is a perspective view showing a portion of a display device according to an embodiment of the invention.
Figure 8B:
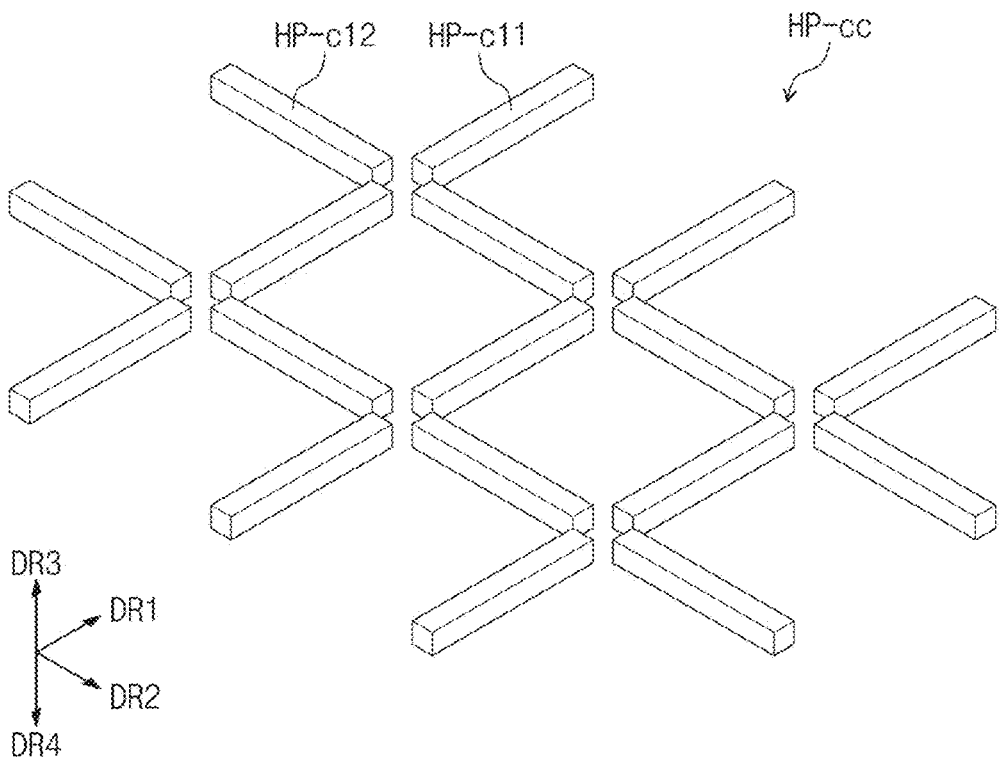
FIG. 8B is a perspective view showing a portion of a display device according to an embodiment of the invention.

FIG. 8A and FIG. 8B are perspective views of heat dissipation sticks HP-c and HP-cc. The heat dissipation sticks HP-c and Hp-cc of FIG. 8A and FIG. 8B may correspond to the first heat dissipation sticks HP-S1 and HP-S11, the impact absorption sticks HP-S21, and the second heat dissipation sticks HP-S2 of FIG. 7A and FIG. 7B.

Referring to FIG. 8A, an embodiment of the heat dissipation sticks HP-c may be extended in a direction in which the first direction axis DR1 is extended, and spaced apart in parallel to the direction in which the second direction axis DR2 is extended. The heat dissipation sticks HP-c may have a square column shape. On the plane defined by the first direction axis DR1 and the second direction axis DR2, the heat dissipation sticks HP-c may have a rectangular shape including two long sides parallel to the direction in which the first direction axis DR1 is extended and two short sides parallel to the direction in which the second direction axis DR2 is extended.

FIG. 8B illustrates an alternative embodiment where the heat dissipation sticks HP-c include first auxiliary heat dissipation sticks HP-c11 and second auxiliary heat dissipation sticks HP-c12. A display device including the heat dissipation sticks HP-cc of FIG. 8B may be rollable in up and down directions and left and right directions.

Each of the first auxiliary heat dissipation sticks HP-c11 and the second auxiliary heat dissipation sticks HP-c12 may have a square column shape. The first auxiliary heat dissipation sticks HP-c11 may have a square column shape of being spaced apart in the direction in which the second direction axis DR2 is extended, and being extended parallel to the direction in which the first direction axis DR1 is extended. The second auxiliary heat dissipation sticks HP-c12 may have a square column shape of being spaced apart in the direction in which the second direction axis DR2 is extended, and being extended parallel to the direction in which the second direction axis DR2 is extended. In such an embodiment, the extension direction of each of the first auxiliary heat dissipation sticks HP-c11 and the extension direction of each of the second auxiliary heat dissipation sticks HP-c12 may cross each other.

On the plane defined by the first direction axis DR1 and the second direction axis DR2, each of the first auxiliary heat dissipation sticks HP-c11 may include two long sides parallel to the direction in which the first direction axis DR1 is extended and two short sides parallel to the direction in which the second direction axis DR2 is extended. In the direction in which the first direction axis DR1 is extended, each of the first auxiliary heat dissipation sticks HP-c11 may have a length shorter than that of each of the heat dissipation sticks HP-c of FIG. 8A.

On the plane defined by the first direction axis DR1 and the second direction axis DR2, each of the second auxiliary heat dissipation sticks HP-c12 may include two short sides parallel to the direction in which the first direction axis DR1 is extended and two long sides parallel to the direction in which the second direction axis DR2 is extended. The first auxiliary heat dissipation sticks HP-c11 and the second auxiliary heat dissipation sticks HP-c12 may be arranged in a plaid shape. Each of the first auxiliary heat dissipation sticks HP-c11 and each of the second auxiliary heat dissipation sticks HP-c12 may be spaced apart by a predetermined distance.

FIG. 8B illustrates an embodiment where lengths of the two short sides and the two long sides included in the first auxiliary heat dissipation sticks HP-c11 and lengths of the two short sides and the two long sides included in the second auxiliary heat dissipation sticks HP-c12 are the same as each other, but the embodiment of the invention is not limited thereto. Alternatively, the size of each of the first auxiliary heat dissipation sticks HP-c11 and the size of each of the second auxiliary heat dissipation sticks HP-c12 may be different from each other. FIG. 8A and FIG. 8B illustrate an embodiment where the heat dissipation sticks HP-c and HP-cc have a square column shape, but this is only exemplary, and shapes of the heat dissipation sticks HP-c are not limited thereto.

A typical display device includes a plurality of members disposed under a display panel for heat dissipation and impact absorption. The plurality of members are coupled by an adhesive layer and include different materials, which causes an increase in thickness and an increase in cost of the display device. In addition, a PET film and the like are disposed between a heat dissipation member and the display panel, which may cause degradation in heat dissipation performance.

In an embodiment of the invention, a display device include a first heat dissipation member and a second heat dissipation member which are directly disposed under a display panel. The first heat dissipation member may include a first polymer resin and first heat dissipation nano-particles dispersed in the first polymer resin, and the second heat dissipation member may include a second polymer resin and second heat dissipation nano-particles dispersed in the second polymer resin. The weight of the first heat dissipation nano-particles in the first heat dissipation member may be different from the weight of the second heat dissipation nano-particles in the second heat dissipation member.

The first heat dissipation member and the second heat dissipation member may protect the display panel from foreign matters and impacts. The display device including the first heat dissipation member and the second heat dissipation member may be provided to be thin, and may exhibit properties in which heat dissipation and impact resistance are improved. In an embodiment, where the display device is a flexible display device capable of a bending, folding, or rolling operation, the first heat dissipation member and the second heat dissipation member may be provided by adjusting thickness, shape, disposition position, and the like to facilitate the bending, folding, or rolling operation.

Figure 9:
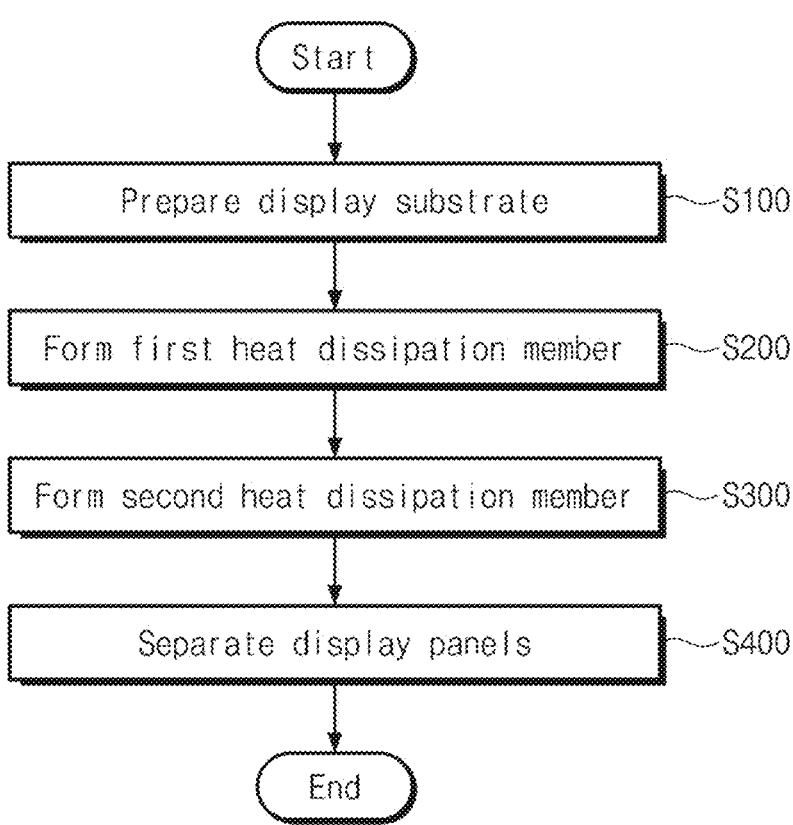
FIG. 9 is a flowchart showing a method for manufacturing a display device of an embodiment of the invention.

In an embodiment of the invention, the display device may be formed by a method for manufacturing a display device of an embodiment. FIG. 9 is a flowchart showing a method for manufacturing a display device of an embodiment of the invention, and FIG. 10A to FIG. 11E are views schematically showing processes of the method for manufacturing a display device of an embodiment of the invention. Hereinafter, in the description of the method for manufacturing a display device of an embodiment provided with reference to FIG. 9 to FIG. 11E, any repetitive detailed description of the same contents as those described above with reference to FIG. 1 to FIG. 8 will be omitted or simplified. Instead, the description will mainly focus on differences.

The method for manufacturing a display device of an embodiment may include preparing a display substrate S100, providing (or forming) a first heat dissipation member S200, providing (or forming) a second heat dissipation member S300, and separating display panels S400. The preparing of a display substrate S100 and the forming of a first heat dissipation member S200 may be performed by an inkjet printing method or a dispensing method.

Figure 10A:
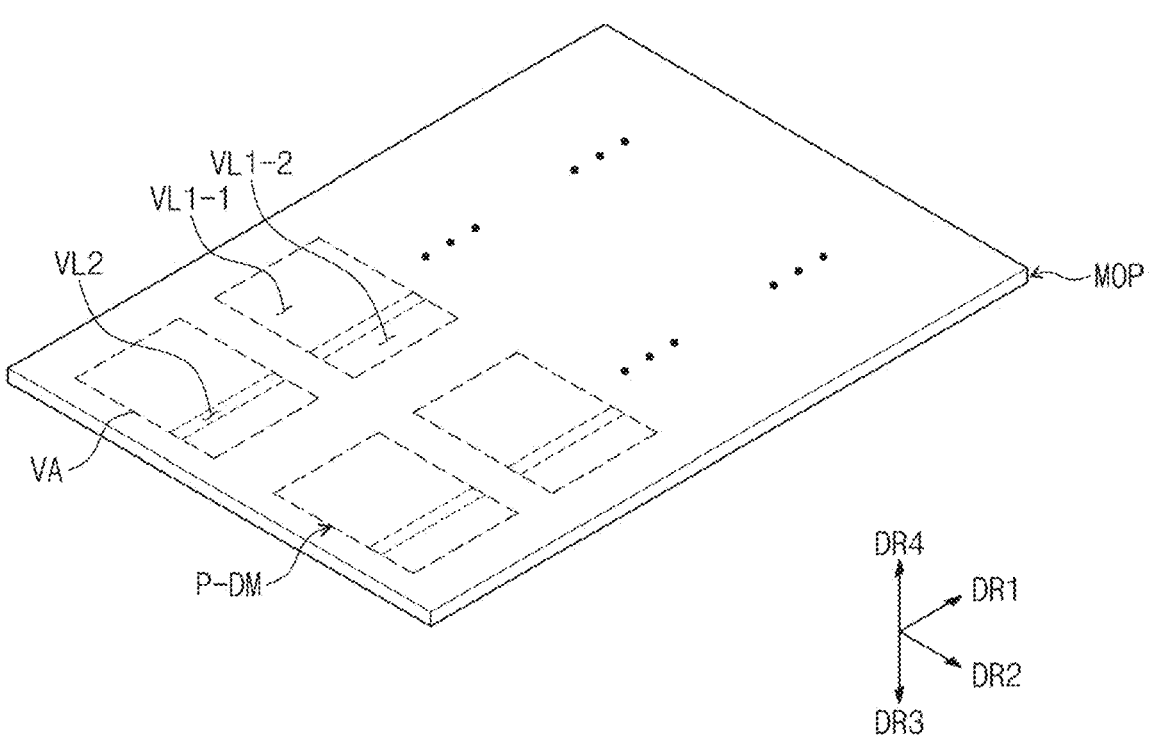
FIG. 10A to FIG. 10D are views schematically showing steps of a method for manufacturing a display device of an embodiment of the invention.

FIG. 10A to FIG. 10D are perspective views showing various embodiments of a display substrate MOP, MOP-a, MOP-b, and MOP-c. Referring to FIG. 10A, a display substrate MOP may include a plurality of preliminary display modules P-DM. The preliminary display modules P-DM may include a preliminary display panel P-DP (see FIG. 11A) and an input sensing layer ISL (see FIG. 11A) disposed on the preliminary display panel P-DP (see FIG. 11A). The display substrate MOP may be a mother substrate.

The preliminary display modules P-DM may be disposed in two rows in a direction in which a second direction axis DR2 is extended. In each row, the preliminary display modules P-DM may be spaced apart in parallel to a direction in which a first direction axis DR1 is extended.

Referring to FIG. 10A, a partition region VA may be designed or defined to separate each of the preliminary display modules P-DM from the display substrate MOP. The separation of the preliminary display modules P-DM may be performed after the forming of a second heat dissipation member HP-2 (see FIG. 11E).

The partition region BA may have a rectangular shape including two short sides parallel to the direction in which the first direction axis DR1 is extended and two long sides parallel to the direction in which the second direction axis DR2 is extended. However, this is only exemplary, and the shape of the partition region VA is not limited thereto. The shape of the partition region VA may be changed to be suitable for a desired display device. In FIG. 10A, only fourth partition regions VA are illustrated for convenience of illustration, but the number of the partition region VA included in the display substrate MOP is not limited thereto.

Each of the preliminary display modules P-DM may include a bendable deformation portion VL2 and non-deformation portions VLT-1 and VLT-2 spaced apart from each other with the deformation portion VL2 interposed therebetween. The deformation portion VL2 and the non-deformation portions VLT-1 and VLT-2 may be disposed in the partition region VA. The deformation portion VL2 may have a rectangular shape having two short sides parallel to the direction in which the second direction axis DR2 is extended and two long sides parallel to the direction in which the first direction axis DR1 is extended.

The deformation portion VL2 may correspond to the bending region BA (see FIG. 2A) described above. A first non-deformation portion VLT-1 may correspond to the first non-bending region NBA1 (see FIG. 2A) described above, and a second non-deformation portion VL1-2 may correspond to the second non-bending region NBA2 (see FIG. 2A) described above.

In the direction in which the second direction axis DR2 is extended, the deformation portion VL2 may be disposed adjacent to one end of the partition region VA. Accordingly, on a plane defined by the first direction axis DR1 and the second direction axis DR2, the area of the first non-deformation portion VLT-1 may be greater than the area of the second non-deformation portion VLT-2. On the plane defined by the first direction axis DR1 and the second direction axis DR2, the shape of the first non-deformation portion VLT-1 and the shape of the second non-deformation portion VLT-2 may be changed to correspond to the first non-bending region NBA1 and the second non-bending region NBA2 of FIG. 2A.

Figure 10B:
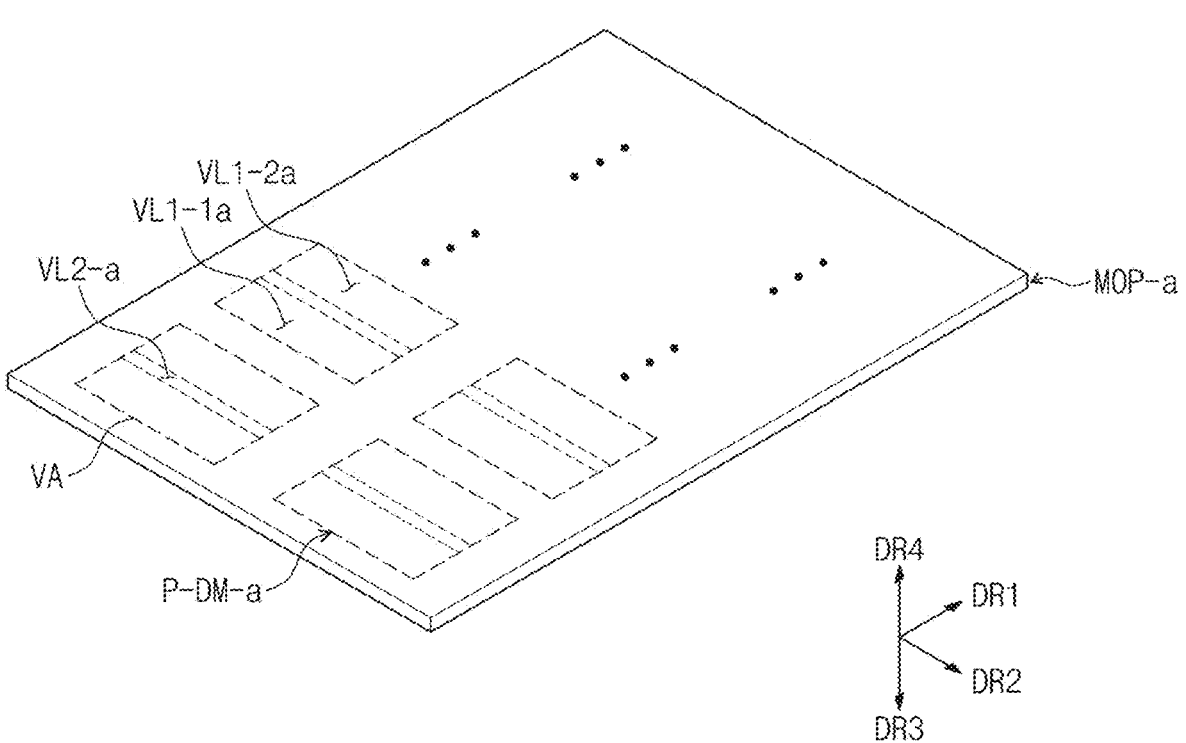

FIG. 10B illustrates an alternative embodiment of a display substrate MOP-a in which a deformation portion VL2-a is disposed in the central portion of the partition region VA. FIG. 10B illustrates an embodiment where, on the plane defined by the first direction axis DR1 and the second direction axis DR2, the area of a first non-deformation portion VL1-1a and the area of a second non-deformation portion VL1-2a are the same as each other. The display substrate MOP-a may include a plurality of preliminary display modules P-DM-a. Each of the preliminary display modules P-DM-a may include the deformation portion VL2-a and the non-deformation portions VL1-1a and VL1-2a.

The deformation portion VL2-a may have a rectangular shape having two short sides parallel to the direction in which the first direction axis DR1 is extended and two long sides parallel to the direction in which the second direction axis DR2 is extended. The deformation portion VL2-a of FIG. 10B may correspond to the folding region FA1 of FIG. 5. The first non-deformation portion VL1-1a may correspond to the first non-folding region NFA1 of FIG. 5, and the second non-deformation portion VL1-2a may correspond to the second non-folding region NFA2 of FIG. 5.

Figure 10C:
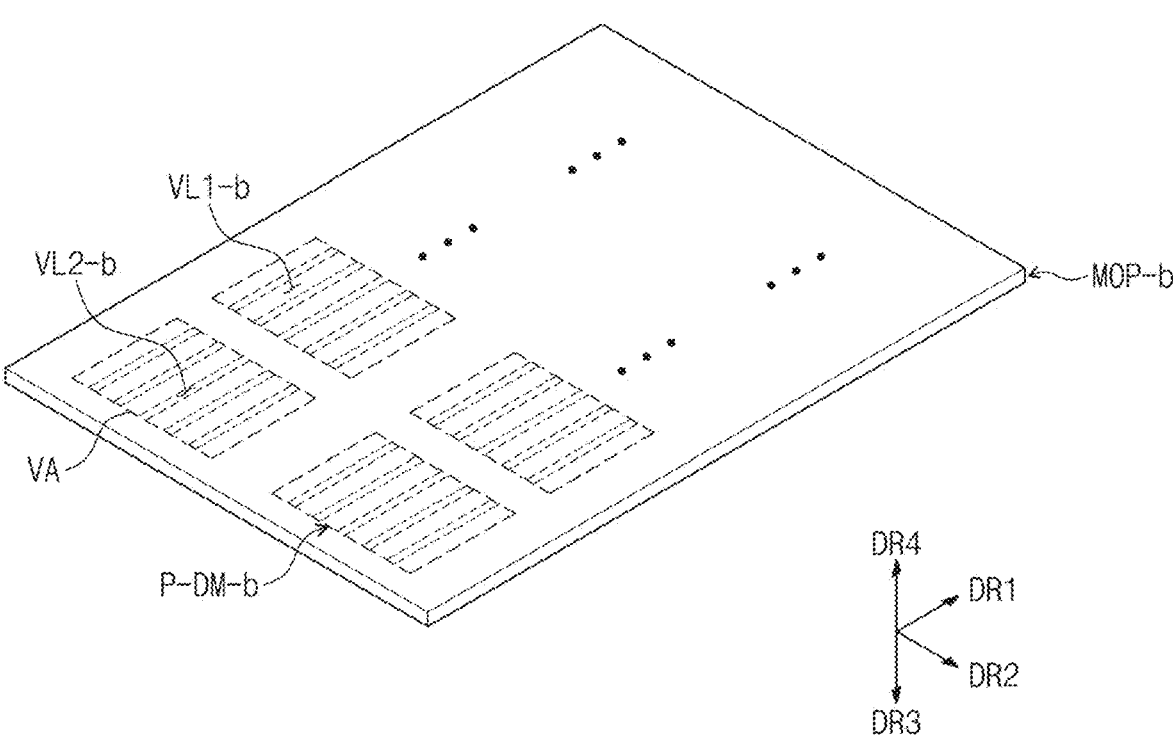

In another alternative embodiment of a display substrate MOP-b, as shown in FIG. 10C, each of preliminary display modules P-DM-b may include a plurality of deformation portions VL2-b and a plurality of non-deformation portion VL1-b spaced apart from each other with the deformation portions VL2-b interposed therebetween. The deformation portions VL2-b may be spaced apart in parallel to the direction in which the first direction axis DR1 is extended. Each of the deformation portions VL2-a may have a rectangular shape including two short sides parallel to the direction in which the second direction axis DR2 is extended and two long sides parallel to the direction in which the first direction axis DR1 is extended.

The deformation portions VL2-b of FIG. 10C may correspond to a region in which the first heat dissipation members HP-1b and HP-1bb and the second heat dissipation member HP-2b are provided in FIG. 7A and FIG. 7B. FIG. 10C illustrates five deformation portions VL2-b, but this is only exemplary, and the number and disposition of deformation portions is not limited to any one embodiment. In an embodiment, where the first heat dissipation members HP-1b and HP-1bb and the second heat dissipation member HP-2b are provided as shown in FIG. 8B, deformation portions may be provided to correspond to a portion in which the first heat dissipation members HP-1b and HP-1bb and the second heat dissipation member HP-2b are provided.

In the forming of a first heat dissipation member S200 and the forming of a second heat dissipation member S300 to be described later, a first coating solution CA-1 (see FIG. 11C) and a second coating solution CA-2 (see FIG. 11D) may be provided to correspond to the non-deformation portions VL1-1, VL1-2, VL1-1a, VL1-2a, and VL1-b of FIG. 10 A to FIG. 10C. The first coating solution CA-b (see FIG. 11C) and the second coating solution CA-2 (see FIG. 11D) may not be provided to the deformation portions VL2, VL2-a, and VL2-b of FIG. 10A to FIG. 10C.

In embodiments shown in FIG. 10A to FIG. 10C, the first coating solution CA-b (see FIG. 11C) and the second coating solution CA-2 (see FIG. 11D) may be provided between adjacent preliminary display modules P-DM, P-DM-a, P-DM-b, and P-DM-c. That is, in embodiments of the display substrate MOP, MOP-a, and MOP-b, the first coating solution CA-b (see FIG. 11C) and the second coating solution CA-2 (see FIG. 11D) may be provided in an outer region of the partition regions VA. The first coating solution CA-1 (see FIG. 11C) and the second coating solution CA-2 (see FIG. 11D) provided between the adjacent preliminary display modules P-DM, P-DM-a, P-DM-b, and P-DM-c may be removed in the separation process S400.

In an embodiment, the first coating solution CA-1 (see FIG. 11C) and the second coating solution CA-2 (see FIG. 11D) may not be provided between the adjacent preliminary display modules P-DM, P-DM-a, P-DM-b, and P-DM-c, and the first coating solution CA-1 (see FIG. 11C) and the second coating solution CA-2 (see FIG. 11D) may be provided corresponding to the non-deformation portions VL1-1, VL1-2, VL1-1a, VL1-2a, and VL1-b in the partition region VA.

Figure 10D:
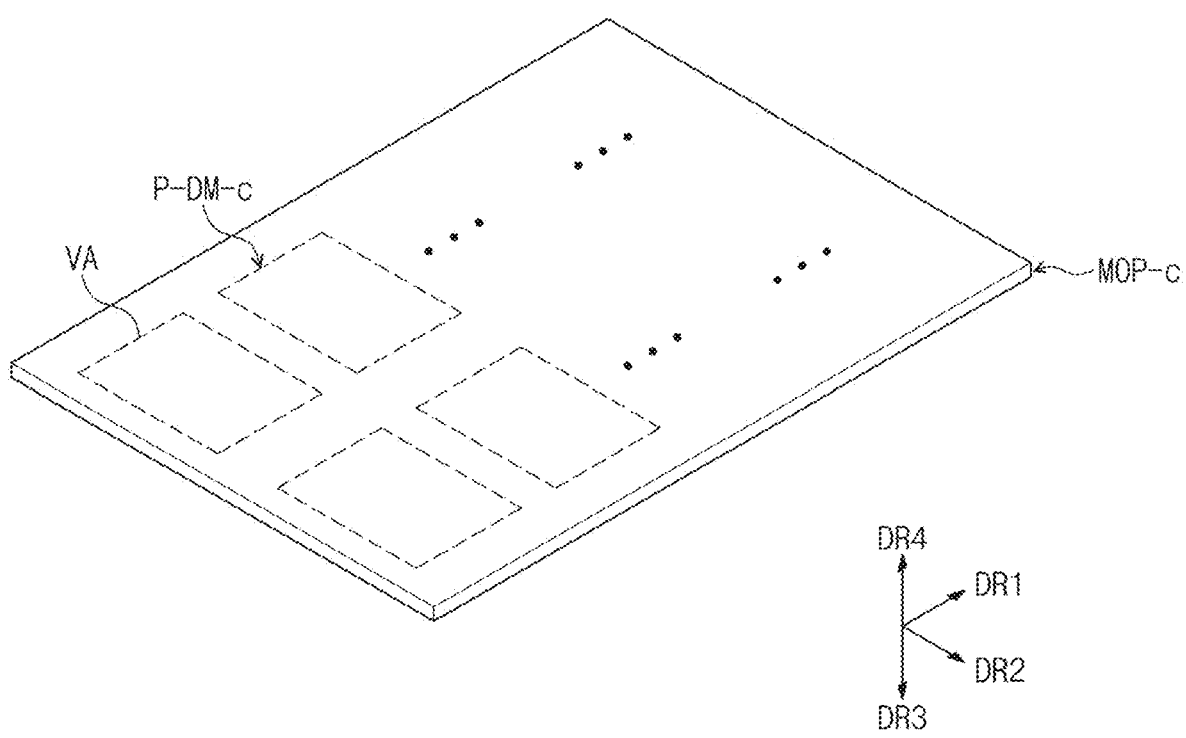

In an embodiment of a display substrate MOP-c of FIG. 10D, preliminary display modules P-DM-c may not include deformation portions. The display substrate MOP-c may include the partition region VA. The partition region VA may be a non-deformation portion. The display substrate MOP-c not including deformation portions may be provided when manufacturing a display device not requiring an operation such as bending or folding. In the forming of a first heat dissipation member S200 and the forming of a second heat dissipation member S300, the first coating solution CA-1 (see FIG. 11C) and the second coating solution CA-2 (see FIG. 11D) may be provided in the partition region VA of FIG. 10D. However, the embodiment of the invention is not limited thereto, and in the display substrate MOP-c, the first coating solution CA-1 (see FIG. 11C) and the second coating solution CA-2 (see FIG. 11D) may be provided in an outer region of the partition regions VA.

Figure 11A:
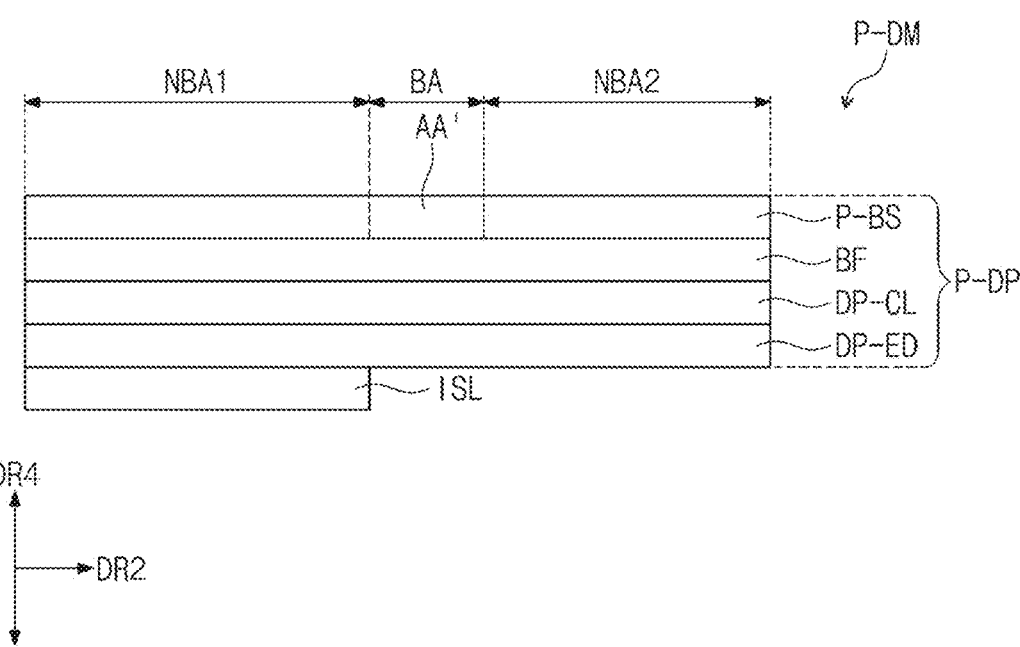
FIG. 11A to FIG. 11E are views schematically showing processes of a method for manufacturing a display device of an embodiment of the invention.

FIG. 11A to FIG. 11E show an embodiment of a method for manufacturing a display device including the display panel DP and the heat dissipation members HP-1 and HP-2 of FIG. 3. FIG. 11A shows preparing a display substrate S100, and shows one preliminary display module among the preliminary display modules P-DM included in the display substrate MOP of FIG. 10D. A bending region BA of FIG. 11A may correspond to the deformation portion VL2 of FIG. 10A, a non-bending region NBA1 may correspond to the non-deformation portion VL1-1 of FIG. 10A, and a second non-bending region NBA2 may correspond to the second non-deformation portion VL1-2 of FIG. 10A.

The preliminary display module P-DM may include a preliminary display panel P-DP. The preliminary display module P-DM may include a display element layer DP-ED, a circuit layer DP-CL, and a preliminary base layer P-BS. The preliminary base layer P-BS may be a glass substrate.

Figure 11B:
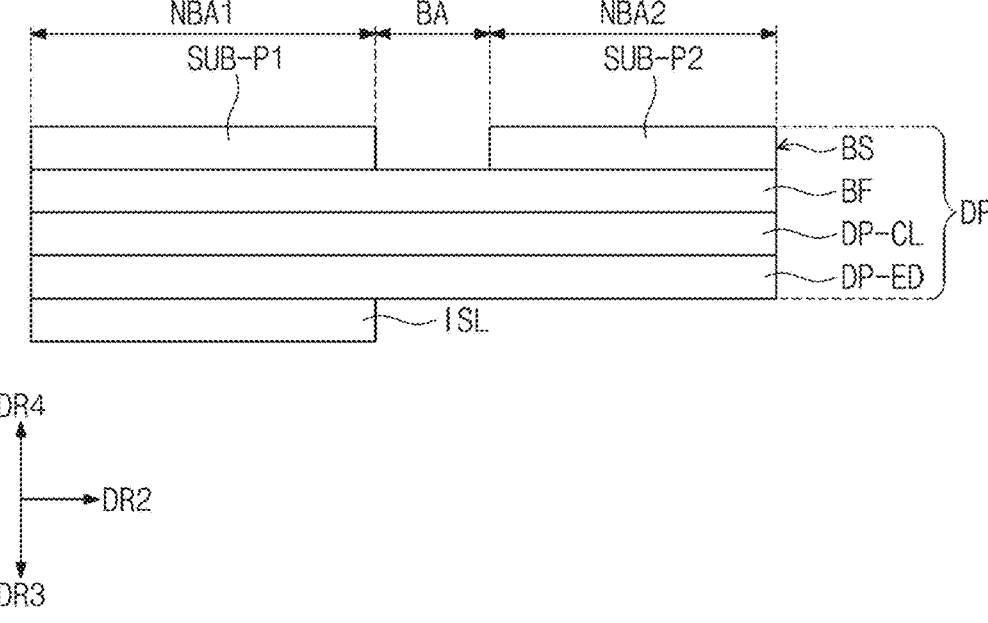

The preparing of a display substrate S100 may include providing (or forming) a buffer layer BF on the preliminary base layer P-BS, providing (or forming) the circuit layer DP-CL on the buffer layer BF, providing (or forming) the display element layer DP-ED on the circuit layer DP-CL, and providing (or forming) a base layer BS (see FIG. 11B). In addition, the preparing of a display substrate S100 may include providing (or forming) an input sensing layer ISL on the display element layer DP-ED.

Referring to FIG. 11A and FIG. 11B, one region AA' of the preliminary base layer P-BS overlapping the bending region BA may be removed to form a first glass substrate SUB-P1 and a second glass substrate SUB-P2. The one region AA' overlapping the bending region BA in the preliminary base layer P-BS may be removed through an etching process. In an embodiment, for example, a solution for removing glass may be provided the one region AA' overlapping the bending region BA in the preliminary base layer P-BS to perform a wet etching process. The solution for removing the one region AA' overlapping the bending region BA in the preliminary base layer P-BS is not limited to any one embodiment, and any solution suitable for removing glass may be used without limitation. However, the embodiment of the invention is not limited thereto, and alternatively, the one region AA' overlapping the bending region BA in the preliminary base layer P-BS may be removed through a dry etching process.

The buffer layer BF of an embodiment may include aluminum, chromium, or titanium. The buffer layer BF may serve as an etch stopper in an etching process of the preliminary base layer P-BS, which is a glass substrate. Accordingly, the buffer layer BF and components such as the circuit layer DP-CL, the display element layer DP-ED and the like disposed on the buffer layer BF may not be etched, and only the preliminary base layer P-BS may be etched. The base layer BS including the first glass substrate SUB-P1 and the second glass substrate SUB-P2 may be formed by etching the one region AA' of the preliminary base layer P-BS.

Figure 11C:
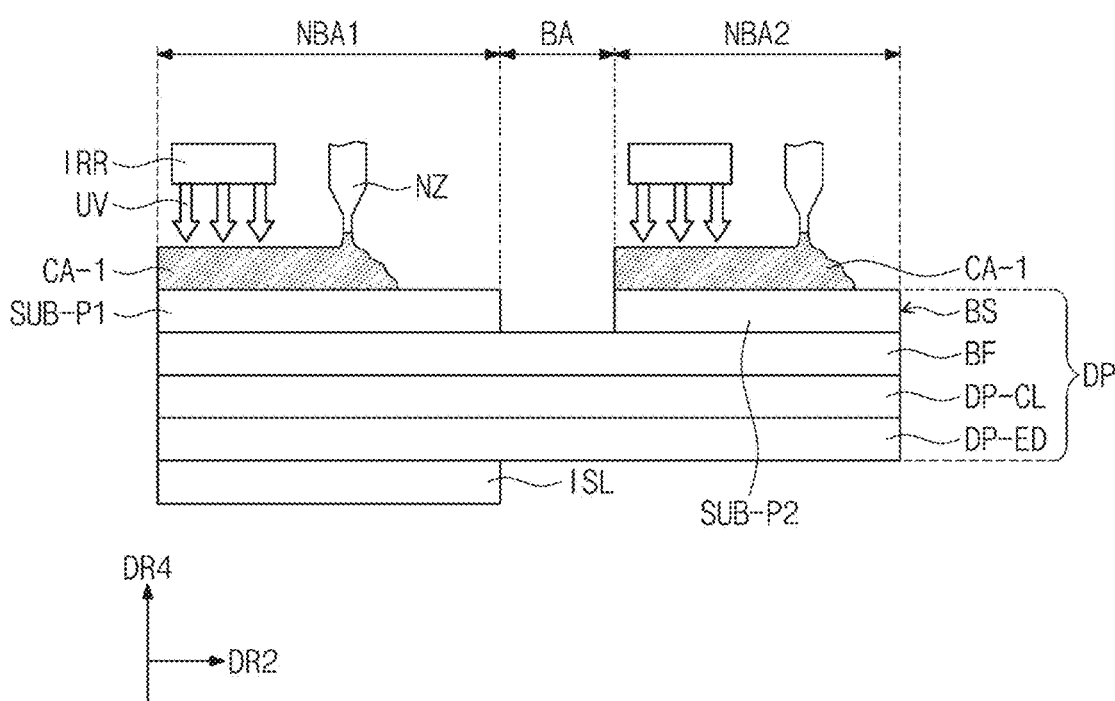

FIG. 11C shows the forming of a first heat dissipation member S200. Referring to FIG. 11C, the first coating solution CA-1 may be provided to a first surface of the base layer BS. The first coating solution CA-1 may be provided by an inkjet printing method or a dispensing method.

The first coating solution CA-1 may include a first base resin and first heat dissipation nano-particles dispersed in the first base resin. The first coating solution CA-1 may be cured by an ultraviolet light UV, thereby forming a first heat dissipation member HP-1. The first base resin may be cured by the ultraviolet light UV, thereby forming the first polymer resin described above. The first coating solution CA-1 may include at least one selected from a polyurethane resin and a polyethylene resin as the first base resin. The first coating solution CA-1 may include at least one selected from reduced graphene oxide (RGO), carbon nanotube (CNT), copper, and aluminum as the first heat dissipation nano-particles. The first coating solution CA-1 may include the first heat dissipation nano-particles in an amount of about 0.1 wt % to about 30 wt % based on the total weight of the first coating solution CA-1.

In the forming of a first heat dissipation member S200, the providing of the first coating solution CA-1 and the photo-curing of the first coating solution CA-1 may be performed in a same process. The first coating solution CA-1 may be provided to the base layer BS, and the ultraviolet light UV may be provided thereto within a time of several seconds (sec). In addition, the ultraviolet light UV may be provided at the same time as the first coating solution CA-1 is provided to the base layer BS. The providing of the first coating solution CA-1 and the photocuring of the first coating solution CA-1 may be performed as an in-situ process, and may be performed as a process of substantially the same step.

In the providing of the first coating solution CA-1, a coating apparatus may be used, and in FIG. 11C, the coating apparatus may include a nozzle NZ. However, this is only exemplary, and the type of the coating apparatus is not limited thereto. In the photocuring of the first coating solution CA-1, a curing apparatus IRR may be used, and the curing apparatus IRR may provide the ultraviolet light UV.

The coating apparatus NZ and the curing apparatus IRR may be spaced apart from each other in one direction. In an embodiment, for example, the coating apparatus NZ and the curing apparatus IRR may be spaced apart in parallel to the direction in which the second direction axis DR2 is extended. The gap between a point at which the first coating solution CA-1 is provided from the coating apparatus NZ and a point at which the ultraviolet light UV is provided from the curing apparatus IRR may be in a range of about 30 millimeters (mm) to about 200 mm. In an embodiment, for example, in the direction in which the second direction axis DR2 is extended, the gap between a point at which the first coating solution CA-1 is provided and a point at which the ultraviolet light UV is provided may be in a range of about 30 mm to about 200 mm. Accordingly, the ultraviolet light UV may be provided within several seconds after the first coating solution CA-1 is provided to the base layer BS, or the ultraviolet light UV may be provided at the same time as the first coating solution CA-1 is provided to the base layer BS.

The first coating solution CA-1 may be provided to each of the first glass substrate SUB-P1 and the second glass substrate SUB-P2. The first coating solution CA-1 may be provided directly on a first surface of the first glass substrate SUB-P1 and on a first surface of the second glass substrate SUB-P2. In such an embodiment, a first heat dissipation plate HP-M1 may be formed from the first coating solution CA-1 provided on the first surface of the first glass substrate SUB-P1, and a second heat dissipation plate HP-M2 may be formed from the first coating solution CA-1 provided on the first surface of the second glass substrate SUB-P2.

The first heat dissipation member HP-1 formed from the first coating solution CA-1 may have adhesion force in a range of about 50 gf/inch to about 2000 gf/inch with respect to the base layer BS. In an embodiment, for example, the adhesion force of the first heat dissipation member with respect to the base layer BS may be about 200 gf/inch or less in the forming of a first heat dissipation member S200, such that it is possible to easily detach a defective first heat dissipation member when a defect is detected in the first heat dissipation member. Thereafter, a new first heat dissipation member HP-1 may be formed under the base layer BS.

The adhesion force of the first heat dissipation member HP-1 may be controlled by a material included in the first coating solution CA-1. In an embodiment, for example, by controlling the content of a base resin included in the first coating solution CA-1, it is possible to control the adhesion force of the first heat dissipation member HP-1 formed from the first coating solution CA-1. However, the method for controlling adhesion force is not limited thereto, and adhesion force may be controlled by the amount of light provided to the first coating solution CA-1, or the time for radiating light to the first coating solution CA-1.

Figure 11D:
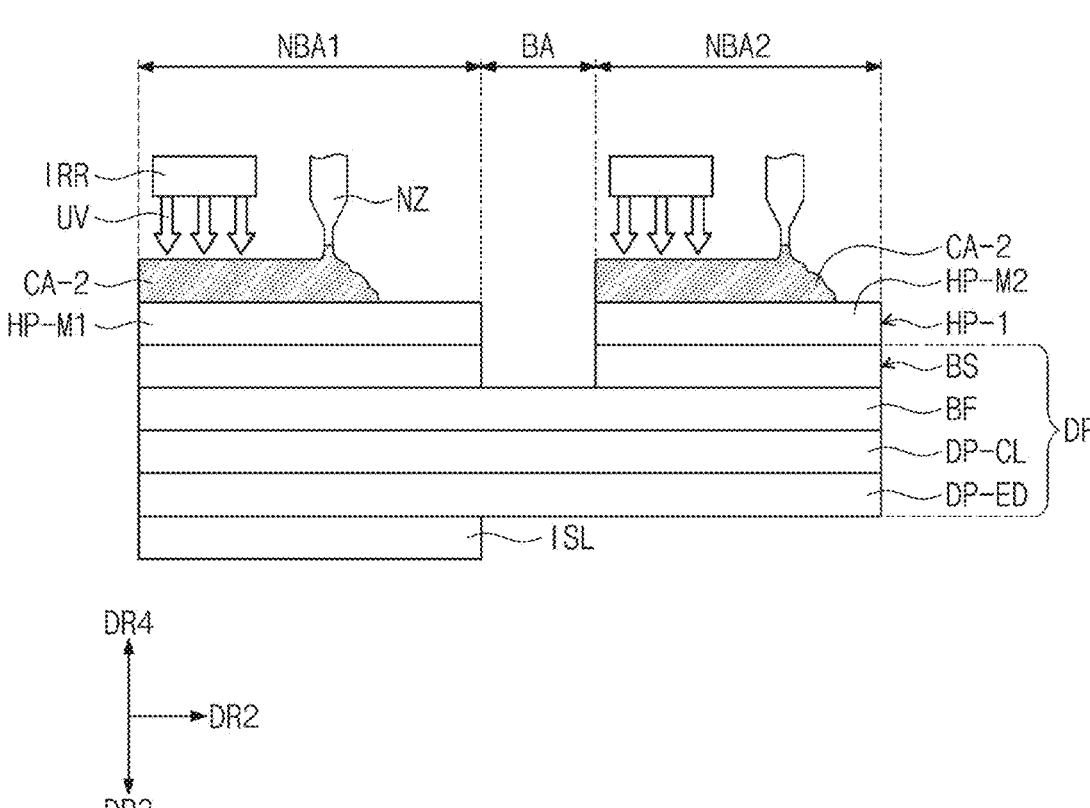
Figure 11E:
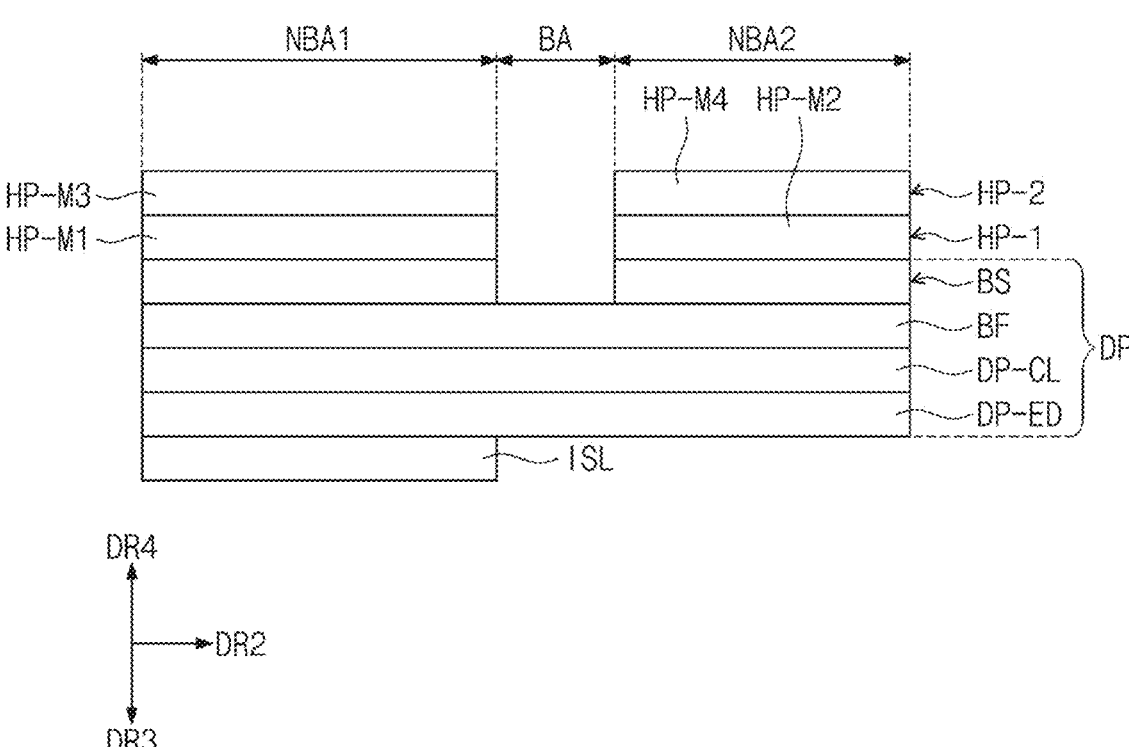

FIG. 11D shows the forming of a second heat dissipation member S300. Referring to FIG. 11D, the second coating solution CA-2 may be provided to a first surface of a first heat dissipation member HP-1b. The second coating solution CA-2 may be provided by an inkjet printing method or a dispensing method, and FIG. 11D illustrates that the second coating solution CA-2 is provide through the nozzle NZ.

The second coating solution CA-2 may include a second base resin and second heat dissipation nano-particles dispersed in the second base resin. The second coating solution CA-2 may be cured by the ultraviolet light UV, thereby forming a second heat dissipation member HP-2. The second base resin may be cured by the ultraviolet light UV, thereby forming the second polymer resin described above. The second coating solution CA-2 may include at least one selected from a polyurethane resin and a polyethylene resin as the second base resin. The second coating solution CA-2 may include at least one selected from reduced graphene oxide (RGO), carbon nanotube (CNT), copper, and aluminum as the second heat dissipation nano-particles. The second coating solution CA-2 may include heat dissipation nano-particles in a weight different from that of heat dissipation nano-particles of the first coating solution CA-1. The second coating solution CA-2 may include heat dissipation nano-particles in a weight greater than that of heat dissipation nano-particles of the first coating solution CA-1. In an embodiment, for example, the second coating solution CA-2 may include the second heat dissipation nano-particles in an amount of greater than about 50 wt % based on the total weight of the second coating solution CA-2. More specifically, the second coating solution CA-2 may include the second heat dissipation nano-particles in an amount of about 60 wt % or greater.

In the forming of a second heat dissipation member S300, the providing of the second coating solution CA-2 and the photocuring of the second coating solution CA-2 may be performed in a same process. That is, the ultraviolet light UV may be provided at the same time as the second coating solution CA-2 is provided to the first heat dissipation member HP-1.

The second coating solution CA-2 may be provided to each of the first heat dissipation plate HP-M1 and the second heat dissipation plate HP-M2. The second coating solution CA-2 may be provided directly on a first surface of the first heat dissipation plate HP-M1 and on a first surface of the second heat dissipation plate HP-M2. In an embodiment, a third heat dissipation plate HP-M3 may be formed from the second coating solution CA-2 provided on the first surface of the first heat dissipation plate HP-M1, and a fourth heat dissipation plate HP-M4 may be formed from the second coating solution CA-2 provided on the first surface of the second heat dissipation plate HP-M2.

The second heat dissipation member HP-2 formed from the second coating solution CA-2 may have adhesion force in a range of about 50 gf/inch to about 2000 gf/inch with respect to the first heat dissipation member HP-1. In an embodiment, for example, the adhesion force of the second heat dissipation member with respect to the first heat dissipation member HP-1 may be about 200 gf/inch or less, such that it is possible to easily detach a defective second heat dissipation member when a defect is detected in the second heat dissipation member. Thereafter, a new second heat dissipation member HP-2 may be provided under the first heat dissipation member HP-1.

The adhesion force of the second heat dissipation member HP-2 may be controlled by a material included in the second coating solution CA-2. In an embodiment, for example, by controlling the content of a base resin included in the second coating solution CA-2, it is possible to control the adhesion force of the second heat dissipation member HP-2 formed from the second coating solution CA-2. However, the method for controlling adhesion force is not limited thereto, and adhesion force may be controlled by the amount of light provided to the second coating solution CA-2, or the time for irradiating light to the second coating solution CA-2.

As described above, in embodiments of the display substrate MOP-a and MOP-b of FIG. 10B and FIG. 10C, the deformation portions VL2-a and VL2-b may correspond to the bending region BA of FIG. 11A to FIG. 11E, and the non-deformation portions VL1-1a, VL1-2a, and VL1-b may correspond to the non-bending regions NBAT and NBA2 of FIG. 11A to FIG. 11E. Accordingly, in the method for manufacturing a display device of an embodiment, the first coating solution CA-1 and the second coating solution CA-2 may not be provided to the deformation portions VL2-a and VL2-b of FIG. 10B and FIG. TOC, and the first coating solution CA-1 and the second coating solution CA-2 may be provided to the non-deformation portions VL1-1a, VL1-2a, and VL1-b to form the heat dissipation members HP-1a, HP-2a, HP-Tb, and HP-2b (see FIGS. 5, 7A, and 7B).

The method for manufacturing a display device of an embodiment may include preparing a display substrate, providing a first coating solution to form a first heat dissipation member, providing a second coating solution to form a second heat dissipation member, and separating preliminary display panels included in the display substrate. Each of the first coating solution and the second coating solution is provided by an inkjet printing method or a dispensing method, and may include a base resin and heat dissipation nano-particles dispersed in the base resin. The liquid-phase first coating solution and the second coating solution may be photocured to form the first heat dissipation member and the second heat dissipation member. Accordingly, the method for manufacturing a display device of an embodiment may exhibit properties of having improved manufacturing efficiency. In addition, a display device formed by the method for manufacturing a display device of an embodiment may have improved heat dissipation performance and impact resistance.

FIG. 12A to FIG. 12D show an alternative embodiment of a method for manufacturing a display device of the invention, and show a method for manufacturing a display device including the display panel DP-X and the heat dissipation members HP-1X and HP-2 of FIG. 3D.

Figure 12A:
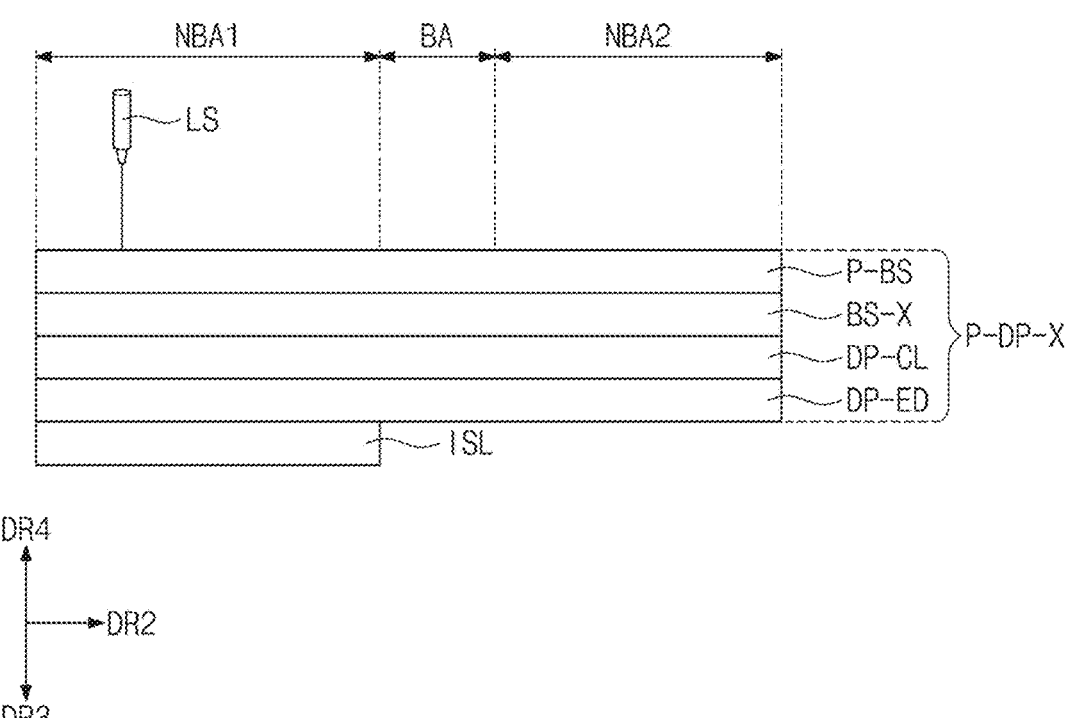
FIG. 12A to FIG. 12D are views schematically showing processes of a method for manufacturing a display device of an embodiment of the invention.

FIG. 12A shows a part of preparing a display substrate S100. The preparing of a display substrate S100 may include providing a polyimide substrate BS-X on a preliminary base layer P-BS, forming a circuit layer DP-CL on the polyimide substrate BS-X, forming a display element layer DP-ED on the circuit layer DP-CL, and removing the preliminary base layer P-BS, which is a glass substrate.

Referring to FIG. 12A, a preliminary display panel P-DP-X of the display substrate may include the display element layer DP-ED, the circuit layer DP-CL, and the preliminary base layer P-BS. In addition, the preliminary display panel P-DP-X may include the polyimide substrate BS-X disposed on the preliminary base layer P-BS. The preliminary base layer P-BS may be a glass substrate. A laser LS may be provided to the preliminary base layer P-BS to remove the preliminary base layer P-BS. The preliminary base layer P-BS, which is a glass substrate, may be removed by a laser lift off (LLO) process. The polyimide substrate, which remains after the removal of the preliminary base layer P-BS, may be a base layer BS-X.

Figure 12B:
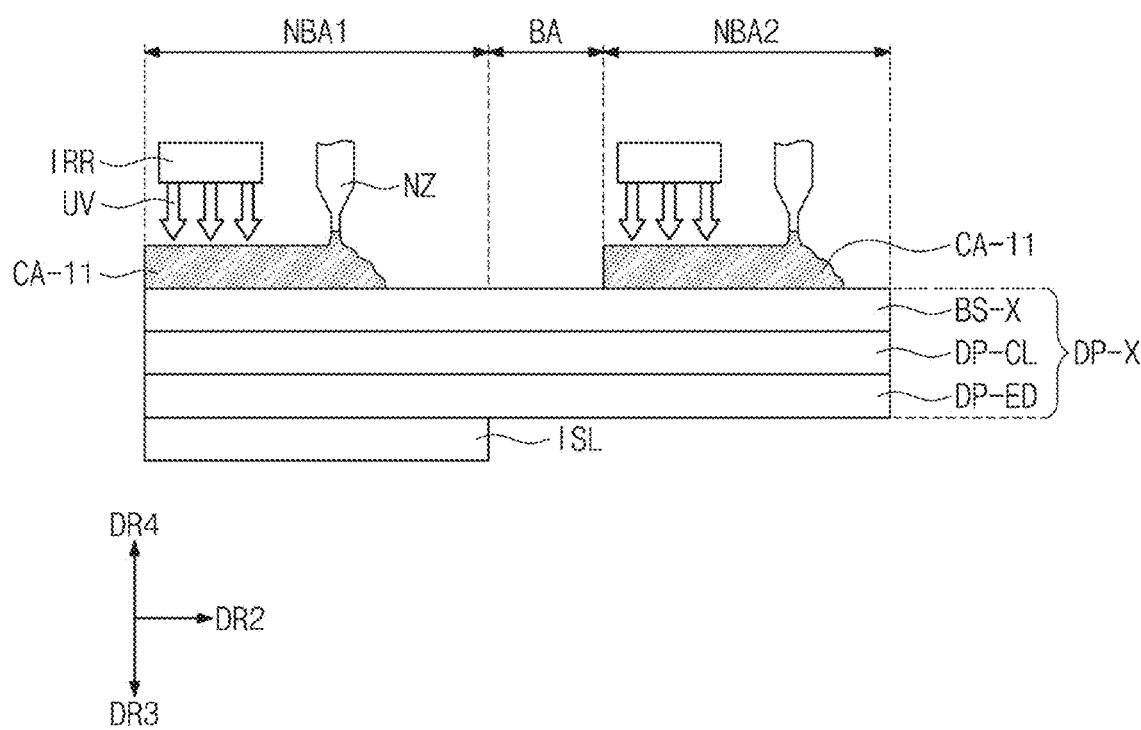
Figure 12C:
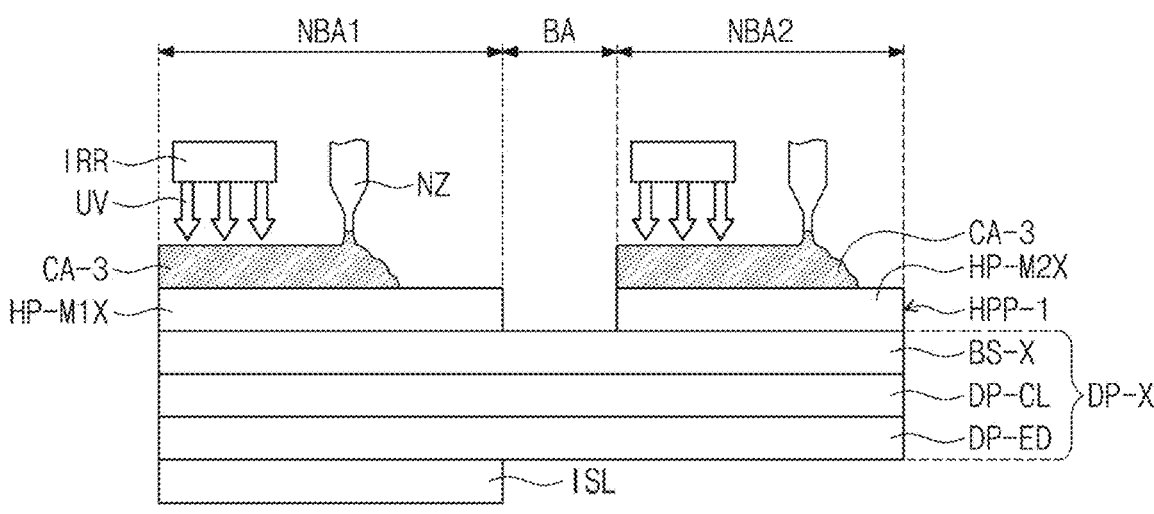
Figure 12C:
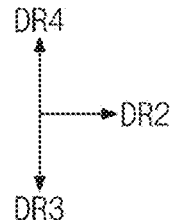

FIG. 12B and FIG. 12C show forming a first heat dissipation member S200. The forming of a first heat dissipation member S200 may include providing a first coating solution CA-11 to form a heat dissipation plate HPP-1, and providing a third coating solution CA-3 including an acrylate resin to a first surface of the heat dissipation plate HPP-1 to form an impact absorption layer SH-1.

FIG. 12B shows the providing of a first coating solution CA-11 to form a heat dissipation plate HPP-1. The first coating solution CA-11 may be provided to a lower portion (or surface) of the base layer BS-X, which is a polyimide substrate, to form the heat dissipation plate HPP-1 including a first heat dissipation plate HP-M1X and a second heat dissipation plate HP-M2X. The first coating solution CA-11 may include a base resin and first heat dissipation nano-particles dispersed in the base resin. In an embodiment, for example, the first coating solution CA-11 may include at least one selected from a polyurethane resin and a polyethylene resin as the base resin. The first coating solution CA-11 may include at least one selected from reduced graphene oxide (RGO), carbon nanotube (CNT), copper, and aluminum as the first heat dissipation nano-particles.

The first coating solution CA-11 provided when forming the heat dissipation plate HPP-1 may not include an acrylate resin. In an embodiment, where a first heat dissipation member HP-1X is defined by two layers, the first coating solution CA-11 provided to a first surface of the base layer BS-X to form the heat dissipation plate HPP-1 may not include an acrylate resin. In an embodiment the first heat dissipation member HP-1 (FIG. 3A) is defined by a single layer, the first coating solution CA-1 (see FIG. 11C) provided to a first surface of the base layer BS (see FIG. 11C) to form the first heat dissipation member HP-1 (FIG. 3A) may include an acrylate resin.

Referring to FIG. 12C, the third coating solution CA-3 may be provided corresponding to each of the first heat dissipation plate HP-M1X and the second heat dissipation plate HP-M2X. The third coating solution CA-3 may not include heat dissipation nano-particles, but may include an acrylate resin. In an embodiment, for example, the third coating solution CA-3 may include at least one selected from a silicone acrylate resin and an epoxy acrylate resin. In the forming of an impact absorption layer SH-1, the providing of the third coating solution CA-3 and photocuring of the third coating solution CA-3 may be performed in the same step. That is, an ultraviolet light UV may be provided at the same time as the third coating solution CA-3 is provided to the heat dissipation plate HPP-1.

Figure 12D:
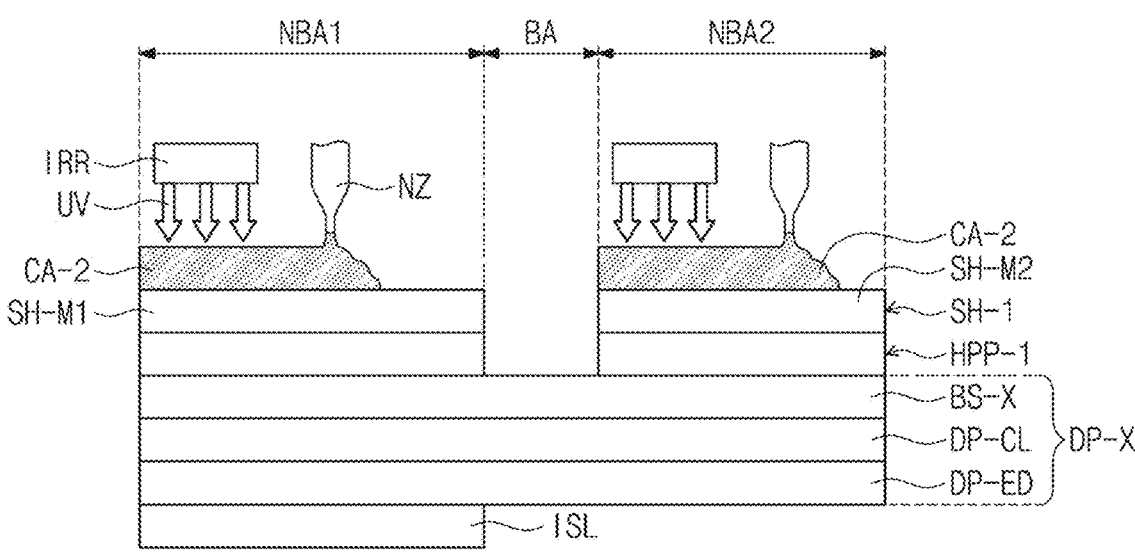
Figure 12D:
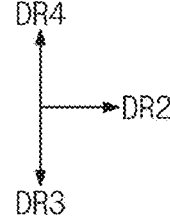

Referring to FIG. 12D, a second coating solution CA-2 may be provided to a lower portion of the impact absorption layer SH-1. The second coating solution CA-2 may be provided corresponding to each of a first impact absorption part SH-M1 and a second impact absorption part SH-M2. The second coating solution CA-2 may include a second base resin and second heat dissipation nano-particles dispersed in the second base resin. In an embodiment, for example, the second coating solution CA-2 may include at least one selected from a polyurethane resin and a polyethylene resin as the second base resin. The second coating solution CA-2 may include at least one selected from reduced graphene oxide (RGO), carbon nanotube (CNT), copper, and aluminum as the second heat dissipation nano-particles.

An embodiment of the display panel DP-X shown in FIG. 3B may be formed through the manufacturing process shown in FIG. 12A. Thereafter, the first coating solution CA-1 (see FIG. 11C) may be provided to the first surface of the base layer BS-X included in the display panel DP-X to form the first heat dissipation member HP-1, and the second coating solution CA-2 (see FIG. 11D) may be provided to form a second heat dissipation member HP-2. Each of the first coating solution CA-1 (see FIG. 11C) and the second coating solution CA-2 (see FIG. 11D) may not be provided to a region overlapping the bending region BA in the base layer BS-X.

An embodiment of the display panel DP shown in FIG. 3C may be formed through the manufacturing process shown in FIG. 11A. Thereafter, the first coating solution CA-1 (see FIG. 11C) may be provided to the first surface of the base layer BS (see FIG. 3) included in the display panel DP (see FIG. 3) to form the heat dissipation plate HPP-1 (see FIG. 3C), the third coating solution CA-3 (see FIG. 12B) may be provided to form the impact absorption layer SH-1 (see FIG. 3C), and the second coating solution CA-2 (see FIG. 11D) may be provided to form the second heat dissipation member HP-2 (see FIG. 3C). The first coating solution CA-1 (see FIG. 11C) may be provided corresponding to the first glass substrate SUB-P1 (see FIG. 3C) and the second glass substrate SUB-P2 (see FIG. 3C) included in the base layer BS (see FIG. 3C).

In an embodiment of the display panel DP-Y shown in FIG. 3E, where the base layer BS-Y is a polyimide substrate, the display panel DP-Y may be formed through the manufacturing step shown in FIG. 12A. Thereafter, the first coating solution CA-1 may be provided to a first surface of the base layer BS-Y included in the display panel DP-Y to form a first heat dissipation member HP-1Y, and the first coating solution CA-1 may be applied thin in a first region HP-A1 overlapping the bending region BA, and applied thick in a second region HP-A2 overlapping the non-bending regions NBA1 and NBA2. The second coating solution CA-2 may be provided to a first surface of the first heat dissipation member HP-1Y to form the second heat dissipation member HP-2.

In an embodiment of the display panel DP-Y shown in FIG. 3E, where the base layer BS-Y is a glass substrate, the base layer BS-Y is provided to be very thin, and the first coating solution CA-1 may be provided to the first surface of the base layer BS-Y, which is provided to be very thin, to form the first heat dissipation member HP-1Y.

Hereinafter, referring to Experimental Examples and Comparative Examples, a heat dissipating member according to an embodiment of the invention, and a display device including the heat dissipating member will be described in detail. In addition, Experimental Examples below are for illustrative purposes only to facilitate the understanding of embodiments of the invention, and thus, the scope of the invention is not limited thereto.

Table 1 shows the emissivity measured in Comparative Example X1 and Experimental Example 1. Comparative Example X1 does not include a heat dissipation member on a first surface of a base layer, and Experimental Example 1 includes a heat dissipation member on a first surface of a base layer. For the emissivity measurement, an electro galvanized iron (EGI) was used, and as a heat dissipation member, a single-layered graphite sheet (E-Graf) was used. The graphite sheet used in Experimental Example 1 had a thickness of about 0.2 mm, an emissivity of about 0.7, a thermal conductivity of about 2 W/m K in the thickness direction, and a thermal conductivity of about 200 Watts per meter-Kelvin (W/m K) on a plane perpendicular to the thickness direction. Comparative Example and Experimental Example 1 were disposed on the electro galvanized iron, and the emissivity was measured from the electro galvanized iron.

TABLE 1

| Classifications | Comparative Example X1 | Experimental Example 1 |
|---|---|---|
| Emissivity | 0.45 | 0.7 |

Referring to Table 1, it can be seen that compared to Comparative Example X1 not including a heat dissipation member, Experimental Example 1 including a heat dissipation member had improved emissivity. Accordingly, an embodiment, where a display device includes heat dissipation members disposed under a display panel, may have improved emissivity.

Figure 13:
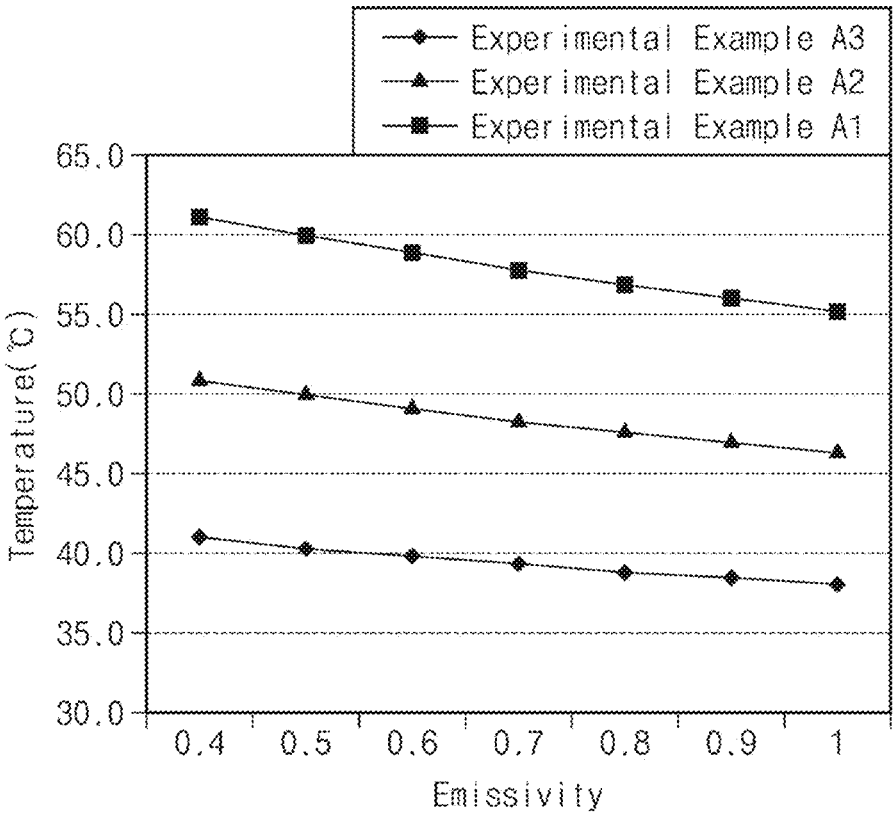
FIG. 13 shows temperature measurements according to emissivity in Comparative Examples and Experimental Examples.

FIG. 13 is a graph showing the temperature measured according to the emissivity in each of Experimental Examples A1 to A3 which include graphite sheets of different thicknesses. A contactless thermometer was used when measuring the temperature, and each of Experimental Examples A1 to A3 includes a graphite sheet on a first side of a base layer, wherein Experimental Example A1 includes a graphite sheet having a thickness of about 40 μm. Experimental Example A2 includes a graphite sheet having a thickness of about 50 μm, and Experimental Example A3 includes a graphite sheet having a thickness of about 60 μm.

Referring to FIG. 13, it can be seen that as the emissivity increases in each of Experimental Examples A1 to A3, the temperature therein decreases. It can be seen that Experimental Example A1 shows a temperature of about 61.3° C.

when the emissivity is about 0.4, and shows a temperature of about 57.9° C. when the emissivity is about 0.7. When compared to when the emissivity is about 0.4, it can be seen that Experimental Example A1 shows a temperature decrease by about 5.5% when the emissivity is about 0.7.

It can be seen that Experimental Example A2 shows a temperature of about 51.0° C. when the emissivity is about 0.4, and shows a temperature of about 48.5° C. when the emissivity is about 0.7. When compared to when the emissivity is about 0.4, it can be seen that Experimental Example A2 shows a temperature decrease by about 4.9% when the emissivity is about 0.7.

It can be seen that Experimental Example A3 shows a temperature of about 41.0° C. when the emissivity is about 0.4, and shows a temperature of about 39.4° C. when the emissivity is about 0.7. When compared to when the emissivity is about 0.4, it can be seen that Experimental Example A3 shows a temperature decrease by about 3.9% when the emissivity is about 0.7.

In addition, referring to FIG. 13, it can be seen that the temperature of Experimental Example A3 is lower than the temperature of Experimental Example A1 under the same emissivity condition. When a measured temperature is low, it means the heat dissipation performance is better, so that it can be seen that the greater the thickness of a graphite sheet, the better the heat dissipation performance thereof.

Figure 14A:
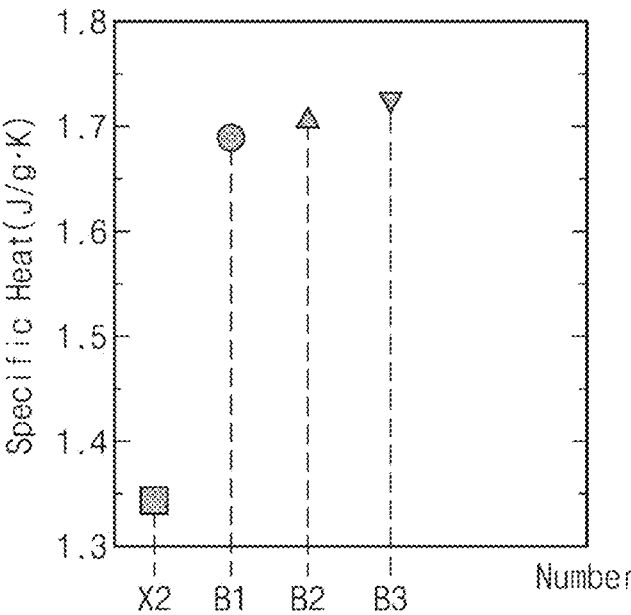
FIG. 14A shows specific heat measurements in Comparative Examples and Experimental Examples.
Figure 14B:
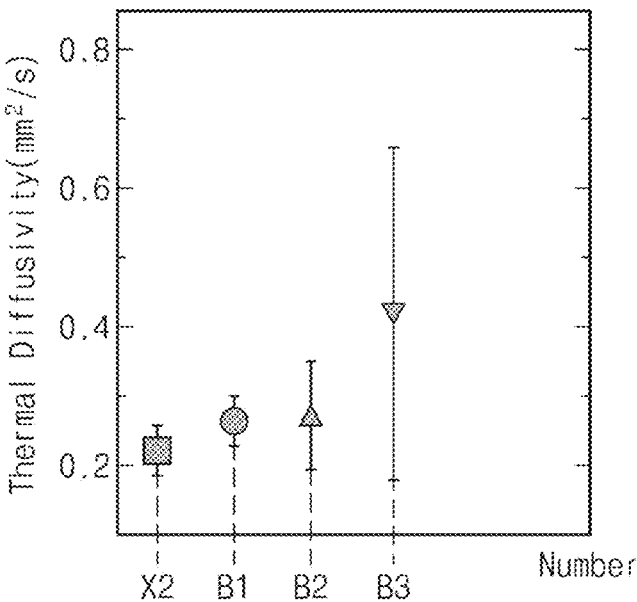
FIG. 14B shows thermal diffusivity measurements in Comparative Examples and Experimental Examples.
Figure 14C:
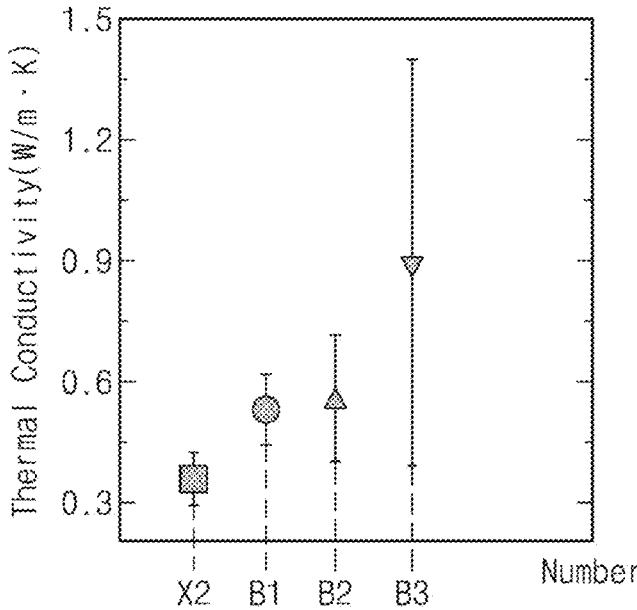
FIG. 14C shows thermal conductivity measurements in Comparative Examples and Experimental Examples.

FIG. 14A to FIG. 14C show specific heat measurements, thermal diffusivity measurements, and thermal conductivity measurements in Comparative Example X2 and Experimental Examples B1 to B3. The specific heat, thermal diffusivity, and thermal conductivity were measured using LFA 467 of Netzsch Corporation. Each of Experimental Examples B1 to B3 is a specimen of a heat dissipation member, and the heat dissipation member was prepared by applying and curing an acrylate resin and a liquid solution including a reduced graphene oxide (RGO) dispersed in the acrylate resin on a temporary substrate. Experimental Example B1 includes a reduced graphene oxide of about 0.23 wt %, Experimental Example B2 includes a reduced graphene oxide of about 0.45 wt %, and Experimental Example B3 includes a reduced graphene oxide of about 0.9 wt %. Comparative Example X2 includes an acrylate resin, but does not include a reduced graphene oxide.

Referring to FIG. 14A, when compared to Comparative Example X2, it can be seen that Experimental Examples B1 to B3 have improved specific heat, thermal conductivity, and thermal diffusivity. In addition, it can be seen that the greater the weight of the reduce graphene oxide in Experimental Examples B1 to B3, the higher the specific heat, thermal conductivity, and thermal diffusivity. Accordingly, an embodiment, where a heat dissipation member includes a polymer resin and heat dissipation nano-particles dispersed in the polymer resin, may exhibit high heat dissipation properties. In addition, an embodiment where a display device includes the heat dissipation member may have improved reliability.

A display device of an embodiment may include a display panel, a first heat dissipation member disposed under the display panel, and a second heat dissipation member disposed under the first heat dissipation member. Each of the first heat dissipation member and the second heat dissipation member may include a polymer resin and heat dissipation nano-particles dispersed in the polymer resin. The weight of the heat dissipation nano-particles in the first heat dissipation member may be different from the weight of the heat dissipation nano-particles in the second heat dissipation member. Accordingly, the display device of an embodiment may have a reduced thickness, and may exhibit properties in which heat dissipation performance and impact resistance are improved.

The display device of an embodiment may be formed by a method for manufacturing a display device of an embodiment. The method for manufacturing a display device of an embodiment may include providing a first coating solution directly to a lower portion of a display substrate including preliminary display panels to form a first heat dissipation member, and providing a second coating solution directly to a lower portion of the first heat dissipation member to form a second heat dissipation member. Each of the first coating solution and the second coating solution includes a base resin and heat dissipation nano-particles, and the base resin may be photocured by light to form a polymer resin. The first coating solution and the second coating solution may be provided by an inkjet printing method or a dispensing method. Accordingly, the method for manufacturing a display device of an embodiment may exhibit properties of having improved manufacturing efficiency.

A display device of an embodiment includes a heat dissipation member directly disposed under a display panel and including a polymer resin and heat dissipation nano-particles dispersed in the polymer resin, and thus, may have improved heat dissipation performance and reduced thickness.

A method for manufacturing a display device of an embodiment provides a coating solution including a base resin and heat dissipation nano-particles dispersed in the base resin by an inkjet printing method or a dispensing method, and thus, may have improved manufacturing efficiency.

The invention should not be construed as being limited to the embodiments set forth herein. Rather, these embodiments are provided so that this disclosure will be thorough and complete and will fully convey the concept of the invention to those skilled in the art.

While the invention has been particularly shown and described with reference to embodiments thereof, it will be understood by those of ordinary skill in the art that various changes in form and details may be made therein without departing from the spirit or scope of the invention as defined by the following claims.

What is claimed is:

1. A display device comprising:
a display panel including a base layer;
a first heat dissipation member disposed on a first surface of the base layer, wherein the first heat dissipation member includes a first polymer resin and a first heat dissipation nano-particle dispersed in the first polymer resin; and
a second heat dissipation member disposed on a first surface of the first heat dissipation member, wherein the second heat dissipation member includes a second polymer resin and a second heat dissipation nano-particle dispersed in the second polymer resin,
wherein a weight of the first heat dissipation nano-particle in the first heat dissipation member is different from a weight of the second heat dissipation nano-particle in the second heat dissipation member,
the display panel comprises a first non-bending region, a second non-bending region spaced apart from the first non-bending region, and a bending region disposed between the first non-bending region and the second non-bending region,
wherein a first region of the first heat dissipation member overlaps the bending region and has a first thickness, and a second region of the first heat dissipation member overlaps the first non-bending region and the second non-bending region and has a second thickness, which is greater than the first thickness, and
wherein a third region of the second heat dissipation member overlaps the bending region and has a third thickness, and a fourth region of the second heat dissipation member overlaps the first non-bending region and the second non-bending region and has a fourth thickness, which is greater than the third thickness.

2. The display device of claim 1, wherein each of the first heat dissipation nano-particle and the second heat dissipation nano-particle comprises at least one selected from reduced graphene oxide (RGO), carbon nanotube (CNT), copper, and aluminum.

3. The display device of claim 1, wherein:
the first heat dissipation nano-particle included in the first heat dissipation member is in an amount in a range of about 0.1 wt % to about 30 wt % based on a total weight of the first heat dissipation member; and
the weight of the second heat dissipation nano-particle is greater than the weight of the first heat dissipation nano-particle.

4. The display device of claim 1, wherein each of the first polymer resin and the second polymer resin comprises at least one selected from a polyurethane resin and a polyethylene resin.

5. The display device of claim 1, wherein the first heat dissipation member comprises a heat dissipation plate and an impact absorption layer disposed on a first surface of the heat dissipation plate.

6. The display device of claim 5, wherein the impact absorption layer comprises at least one selected from silicone acrylate and epoxy acrylate.

7. The display device of claim 5, wherein a thickness of the impact absorption layer is greater than a thickness of the heat dissipation plate.

8. The display device of claim 5, wherein the impact absorption layer does not comprise the first heat dissipation nano-particle.

9. The display device of claim 5, wherein the impact absorption layer has a storage modulus of about 100 MPa or less measured at about 25° C. by ASTM D 695 method.

10. The display device of claim 1, wherein a sum of thicknesses of the first heat dissipation member and the second heat dissipation member is in a range of about 10 μm to about 500 μm.

11. The display device of claim 10, wherein a thickness of the first heat dissipation member is greater than a thickness of the second heat dissipation member.

12. The display device of claim 1, wherein
the base layer is a glass substrate, and
the display panel further comprises a buffer layer disposed on a second surface opposite to the first surface of the base layer, wherein the buffer layer comprises at least one selected from aluminum, chrome, and titanium.

13. The display device of claim 1, wherein the display panel comprises a bending region, and a first non-bending region and a second non-bending region spaced apart from each other with the bending region interposed therebetween, wherein:
the first heat dissipation member comprises a first heat dissipation plate and a second heat dissipation plate not overlapping the bending region, and respectively overlapping the first non-bending region and the second non-bending region; and the second heat dissipation member comprises a third heat dissipation plate and a fourth heat dissipation plate not overlapping the bending region, and respectively overlapping the first non-bending region and the second non-bending region.

14. The display device of claim 13, wherein the base layer comprises:

a first glass substrate not overlapping the bending region and overlapping the first non-bending region; and a second glass substrate not overlapping the bending region and overlapping the second non-bending region.

15. The display device of claim 13, wherein the base layer comprises a polyimide substrate.

16. The display device of claim 1, wherein:

the first heat dissipation member has an adhesion force in a range of about 50 gf/inch to about 2000 gf/inch with respect to the base layer measured by ASTM D3330 method; and the second heat dissipation member has an adhesion force in a range of about 50 gf/inch to about 2000 gf/inch with respect to the first heat dissipation member measured by ASTM D3330 method.

17. A display device comprising:

a display panel including a base layer, a circuit layer disposed on the base layer, and a display element layer disposed on the circuit layer; and a heat dissipation member disposed on a first surface of the base layer, wherein the heat dissipation member includes a polymer resin and a heat dissipation nano-particle dispersed in the polymer resin, wherein:

the display element layer includes a pixel definition layer, in which an opening is defined, and a light emitting element including a light emitting layer disposed in the opening; and the heat dissipation member includes a first portion having a first thickness and a second portion having a second thickness which is less than the first thickness, wherein the first portion overlaps the light emitting layer, and the second portion overlaps the pixel definition layer and does not overlap the light emitting layer, and wherein the base layer is disposed between the heat dissipation member and the display element layer.

18. The display device of claim 17, wherein the heat dissipation member comprises:

a first heat dissipation member including a first polymer resin and a first heat dissipation nano-particle dispersed in the first polymer resin; and a second heat dissipation member including a second polymer resin and a second heat dissipation nano-particle dispersed in the second polymer resin.

19. The display device of claim 1, wherein the display device is a portable electronic apparatus, a tablet computer, a car navigation system unit, a game console, a personal computer, a laptop computer, or a wearable device.

* * * * *